United States Patent
Song et al.

(10) Patent No.: US 12,501,711 B2
(45) Date of Patent: Dec. 16, 2025

(54) THREE-DIMENSIONAL BIPOLAR-CMOS-DMOS (BCD) STRUCTURE WITH INTEGRATED BACK-SIDE CAPACITOR

(71) Applicant: SHANGHAI BRIGHT POWER SEMICONDUCTOR CO., LTD., Shanghai (CN)

(72) Inventors: Luyao Song, Shanghai (CN); Hang Fan, Shanghai (CN); Jian Wu, Shanghai (CN); Lei Shi, Shanghai (CN); Shuming Xu, Shanghai (CN)

(73) Assignee: SHANGHAI BRIGHT POWER SEMICONDUCTOR CO., LTD., Shanghai (CN)

( * ) Notice: Subject to any disclaimer, the term of this patent is extended or adjusted under 35 U.S.C. 154(b) by 450 days.

(21) Appl. No.: 17/865,967

(22) Filed: Jul. 15, 2022

(65) Prior Publication Data
US 2023/0317719 A1 Oct. 5, 2023
US 2025/0351581 A9 Nov. 13, 2025

(30) Foreign Application Priority Data
Mar. 31, 2022 (CN) .......................... 202210335847.X

(51) Int. Cl.
| | |
|---|---|
| H10D 88/00 | (2025.01) |
| H01L 23/00 | (2006.01) |
| H01L 25/065 | (2023.01) |
| H01L 25/18 | (2023.01) |
| H10D 84/03 | (2025.01) |

(52) U.S. Cl.
CPC .......... *H10D 88/101* (2025.01); *H01L 24/48* (2013.01); *H01L 25/0657* (2013.01); *H01L 25/18* (2013.01); *H10D 84/038* (2025.01); *H10D 88/01* (2025.01); *H01L 24/29* (2013.01); *H01L 24/32* (2013.01); *H01L 2224/2919* (2013.01); *H01L 2224/32145* (2013.01); *H01L 2224/48105* (2013.01); *H01L 2224/48227* (2013.01); *H01L 2225/0651* (2013.01); *H01L 2225/06544* (2013.01); *H01L 2924/0665* (2013.01)

(58) Field of Classification Search
CPC ................................................ H01L 29/66681
See application file for complete search history.

(56) References Cited

U.S. PATENT DOCUMENTS

2008/0258258 A1* 10/2008 Horikoshi ............... H01L 24/12
257/532

* cited by examiner

*Primary Examiner* — Yu-Hsi D Sun
(74) *Attorney, Agent, or Firm* — Myers Bigel, P.A.

(57) ABSTRACT

A semiconductor structure includes at least a first chip, the first chip comprising a semiconductor substrate and an active layer formed on an upper surface of the substrate, one or more lateral metal-oxide semiconductor devices being formed in the active layer of the first chip. The semiconductor structure further includes at least a first integrated capacitor disposed on a back-side of the semiconductor substrate of the first chip. The first integrated capacitor includes a first conductive layer in electrical connection with the back-side of the substrate, an insulating layer formed on at least a portion of an upper surface of the first conductive layer, and a second conductive layer formed on at least a portion of an upper surface of the insulating layer.

22 Claims, 17 Drawing Sheets

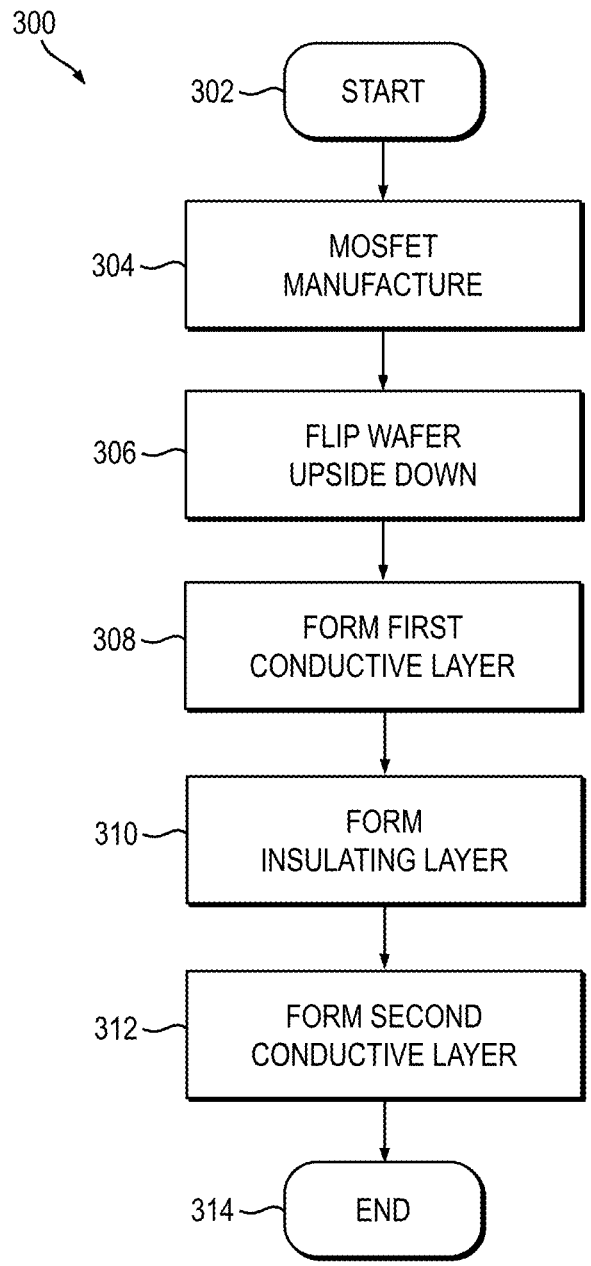

THREE-DIMENSIONAL BIPOLAR-CMOS-DMOS (BCD) STRUCTURE WITH INTEGRATED BACK-SIDE CAPACITOR

CROSS-REFERENCE TO RELATED APPLICATIONS

The present application is a counterpart of, and claims priority to, Chinese Patent Application No. 202210335847.X, filed on Mar. 31, 2022, the disclosure of which is incorporated by reference herein in its entirety for all purposes.

BACKGROUND

The present invention relates generally to the electrical, electronic and computer arts, and, more particularly, to enhanced bipolar-CMOS-DMOS (BCD) structures.

After integrated circuits (ICs) were introduced in the 1950s, several variations of the fundamental technology emerged: those based on bipolar junction transistors (BJTs or bipolar), invented in the 1950s; complementary metal-oxide-semiconductor (CMOS) devices in the 1960s; and double-diffused metal-oxide-semiconductor (DMOS) devices in the 1970s. Beginning in the early 1980s, however, some applications demanded all three types of technology in order to meet higher voltage and faster switching speed requirements. BCD technology, as the name suggests, combines the benefits of bipolar, CMOS and DMOS technologies, integrated together in the same IC package. As a result, BCD technology has become the platform for wide applications, such as power management ICs (PMIC), analog ICs and RF ICs.

However, the integration of bipolar, CMOS and DMOS technologies poses several design challenges. For example, integrating low-voltage CMOS devices with high-voltage DMOS devices increases latch-up and noise in the overall chip design, and therefore care must be taken to effectively isolate low-voltage and high-voltage devices from one another. This required isolation space between low-voltage and high-voltage devices significantly reduces the available active chip area, for a fixed-area chip, or otherwise increases the overall size of the chip. In conventional designs, off-chip or discrete capacitors mounted on an electrical board or inside a chip package are commonly used to reduce noise and stabilize power supply voltages. However, this increases the module size. Furthermore, electrical interconnections between the capacitors and high-voltage devices often introduces significant parasitic impedance (primarily inductance and capacitance), which degrades high-frequency performance.

SUMMARY

The present invention, as manifested in one or more embodiments, beneficially provides an enhanced bipolar-CMOS-DMOS (BCD) device, and methods for fabricating such a device. Embodiments of the invention incorporate a three-dimensional (3D) structure in which low-voltage bipolar and CMOS devices and/or circuitry are beneficially disposed in a stacked arrangement relative to high-voltage DMOS devices and/or circuitry. The 3D structure includes back-side devices and passive components such as integrated capacitors formed using lateral metal-oxide-semiconductor (MOS) technology, which beneficially eliminates, or at least reduces, stray impedance (particularly parasitic inductance) to reduce noise and voltage spikes on switching nodes (SW), and thus provides superior high-frequency performance.

In accordance with an embodiment of the invention, a semiconductor structure includes at least a first chip, the first chip comprising a semiconductor substrate and an active layer formed on an upper surface of the substrate, one or more lateral metal-oxide semiconductor devices being formed in the active layer of the first chip. The BCD structure further includes at least a first integrated capacitor disposed on a back-side of the semiconductor substrate of the first chip. The first integrated capacitor includes a first conductive layer in electrical connection with the back-side of the substrate, an insulating layer formed on at least a portion of an upper surface of the first conductive layer, and a second conductive layer formed on at least a portion of an upper surface of the insulating layer.

In accordance with another embodiment of the invention, a method of fabricating a semiconductor structure includes: forming at least a first chip, the first chip comprising a semiconductor substrate and an active layer formed on an upper surface of the substrate, one or more lateral MOS devices being formed in the active layer of the first chip; and forming at least a first integrated capacitor on a back-side of the semiconductor substrate of the first chip, the first integrated capacitor comprising a first conductive layer in electrical connection with the back-side of the substrate, an insulating layer formed on at least a portion of an upper surface of the first conductive layer, and a second conductive layer formed on at least a portion of an upper surface of the insulating layer.

In accordance with yet another embodiment of the invention, a three-dimensional BCD structure includes at least a first chip comprising at least one power MOS transistor, and at least a second chip comprising driver circuitry disposed in a stacked arrangement relative to the first chip. The BCD structure further includes at least a first integrated capacitor being arranged between the first and second chips and electrically coupled to at least one of the driver circuitry and the at least one power MOS transistor.

In accordance with still another embodiment of the invention, a semiconductor multiple-phase power management module includes a multiple-phase powertrain chip, the multiple-phase powertrain chip comprising a semiconductor substrate and an active layer formed on an upper surface of the substrate, a plurality of lateral MOS devices being formed in the active layer of the multiple-phase powertrain chip. The multiple-phase power management module further includes a plurality of driver chips disposed in a stacked arrangement on a back-side of the multiple-phase powertrain, each of the driver chips including driver circuitry for controlling a corresponding one of the lateral MOS devices formed in the multiple-phase powertrain chip. At least one integrated capacitor is disposed between the plurality of driver chips and the multiple-phase powertrain chip, the integrated capacitor comprising a first conductive layer in electrical connection with the back-side of the substrate of the multiple-phase powertrain chip, an insulating layer formed on at least a portion of an upper surface of the first conductive layer, and a second conductive layer formed on at least a portion of an upper surface of the insulating layer.

Techniques of the present invention can provide substantial beneficial technical effects. By way of example only and without limitation, a three-dimensional BCD structure with back-side integrated capacitor according to one or more embodiments of the invention may provide one or more of the following advantages:

an ability to minimize the distance between the integrated capacitor and relevant loads;

effectively reduces the size of an application module;

effectively eliminated noise caused by parasitic impedance;

low switch node electrical overstress and enhanced robustness of the power stage;

an ability to separately fabricate low-voltage and high-voltage devices on different platforms;

faster development cycle by reusing known good designs and only changing the necessary devices or components;

reduced noise and risk of latch-up due to enhanced isolation between low-voltage and high-voltage devices;

larger active area at specific applications due to reduced or eliminated isolation space between low-voltage and high-voltage devices;

higher power capability and/or higher power density and lower conduction losses due to higher active area utilization at specific applications;

flexible packaging design.

These and other features and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIG. 3 is a flow diagram depicting at least a portion of an exemplary method for fabricating a semiconductor structure including at least one MOSFET device and a back-side integrated input capacitor, according to one or more embodiments of the present invention;

Figure 1:
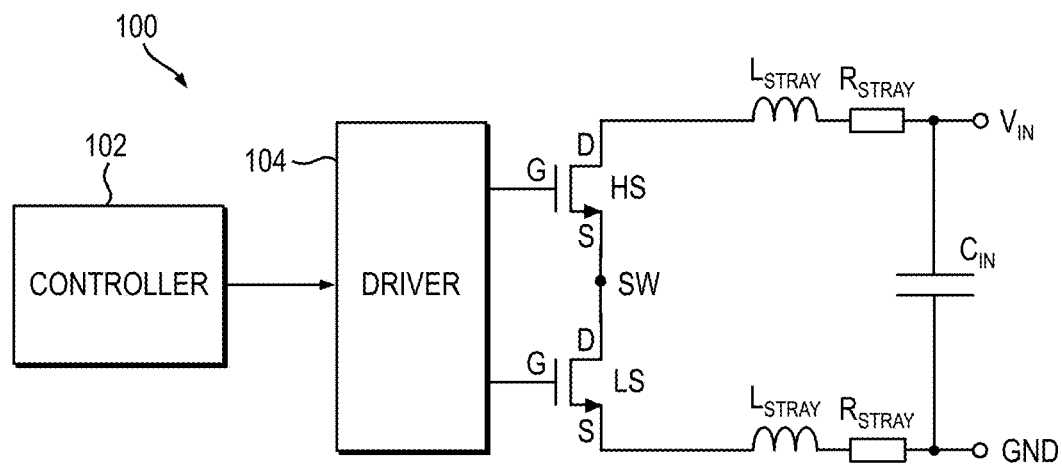
FIG. 1 is a schematic diagram depicting at least a portion of an exemplary power management circuit suitable for use, for example, in a standard direct current (DC)-DC converter application with an off-chip capacitor.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention, as manifested in one or more embodiments, will be described herein in the context of various illustrative three-dimensional (3D) structures, and methods for fabricating such structures, which include low-voltage bipolar and CMOS devices and/or circuitry disposed in a stacked arrangement with high-voltage DMOS devices and/or circuitry. The 3D structures further include a back-side integrated capacitor formed using semiconductor processing steps that are compatible with either CMOS or DMOS process flows, which beneficially eliminates, or at least reduces, parasitic impedance (particularly inductance) to reduce noise and voltage spikes on switching nodes (SW) and thereby achieve superior high-frequency performance. It is to be appreciated, however, that the invention is not limited to the specific device(s) and/or method(s) illustratively shown and described herein. Rather, it will become apparent to those skilled in the art given the teachings herein that numerous modifications can be made to the embodiments shown that are within the scope of the claimed invention. That is, no limitations with respect to the embodiments shown and described herein are intended or should be inferred.

For the purpose of describing and claiming embodiments of the invention, the term MISFET as may be used herein is intended to be construed broadly and to encompass any type of metal-insulator-semiconductor field-effect transistor. The term MISFET is, for example, intended to encompass semiconductor field-effect transistors that utilize an oxide material as their gate dielectric (i.e., MOSFETs), as well as those that do not. In addition, despite a reference to the term "metal" in the acronyms MISFET and MOSFET, the terms MISFET and MOSFET are also intended to encompass semiconductor field-effect transistors wherein the gate is formed from a non-metal material such as, for instance, polysilicon; the terms "MISFET" and "MOSFET" are used interchangeably herein.

Although the overall fabrication method and structures formed thereby are entirely novel, certain individual processing steps required to implement a portion or portions of the method(s) according to one or more embodiments of the invention may utilize conventional semiconductor fabrication techniques and conventional semiconductor fabrication tooling. These techniques and tooling will already be familiar to one having ordinary skill in the relevant arts. Moreover, many of the processing steps and tooling used to fabricate semiconductor devices are also described in a number of readily available publications, including, for example: P. H. Holloway et al., *Handbook of Compound Semiconductors: Growth, Processing, Characterization, and Devices*, Cambridge University Press, 2008; and R. K. Willardson et al., *Processing and Properties of Compound Semiconductors*, Academic Press, 2001, which are incorporated by reference herein in their entireties. It is emphasized that while some individual processing steps are set forth herein, those steps are merely illustrative and one skilled in the art may be familiar with several equally suitable alternatives that would also fall within the scope of the present invention.

It is to be understood that the various layers and/or regions shown in the accompanying figures are not necessarily drawn to scale. Furthermore, one or more semiconductor layers of a type commonly used in such integrated circuit devices may not be explicitly shown in a given figure for economy of description. This does not imply, however, that the semiconductor layer(s) not explicitly shown are omitted in the actual integrated circuit device.

FIG. 1 is a schematic diagram depicting at least a portion of an exemplary power management circuit 100 suitable for use, for example, in a standard DC-DC converter application. The power management circuit 100 includes a controller 102 coupled with a driver 104. The driver 104 is configured to generate control signals for activating a high-side MOSFET device, HS, and/or a low-side MOSFET device, LS, as a function of at least one signal generated by the controller 102. More particularly, a first control signal generated by the driver 104 is supplied to a gate (G) of the high-side MOSFET device, and a second control signal generated by the driver is supplied to a gate of the low-side MOSFET device. A source (S) of the high-side MOSFET device is connected to a drain (D) of the low-side MOSFET device at a switching node, SW. A drain of the high-side MOSFET device is connected to an input voltage terminal, $V_{IN}$, of the power management circuit 100, and a source of the low-side MOSFET device is coupled to a voltage return of the circuit, which is preferably ground (GND).

An external input capacitor, $C_{IN}$, is often placed between the input voltage terminal $V_{IN}$ and ground in order to reduce voltage spikes at the input voltage terminal of the power management circuit 100. The input capacitor $C_{IN}$ generally resides externally to the power management circuit 100 since the capacitance value necessary for reducing voltage spikes is typically too large to be fabricated on-chip without consuming significant chip area. However, because the input capacitor $C_{IN}$ resides externally with respect to the power management circuit 100, it cannot be connected in close proximity to the power MOSFET devices, HS and LS. Consequently, significant stray (i.e., parasitic) inductance, $L_{STRAY}$, and resistance, $R_{STRAY}$, will be introduced in series between the input capacitor $C_{IN}$ and the power MOSFET devices HS and LS. This stray impedance ($L_{STRAY}$ and $R_{STRAY}$) will lead to switch-mode ringing, which is undesirable.

Figure 2:
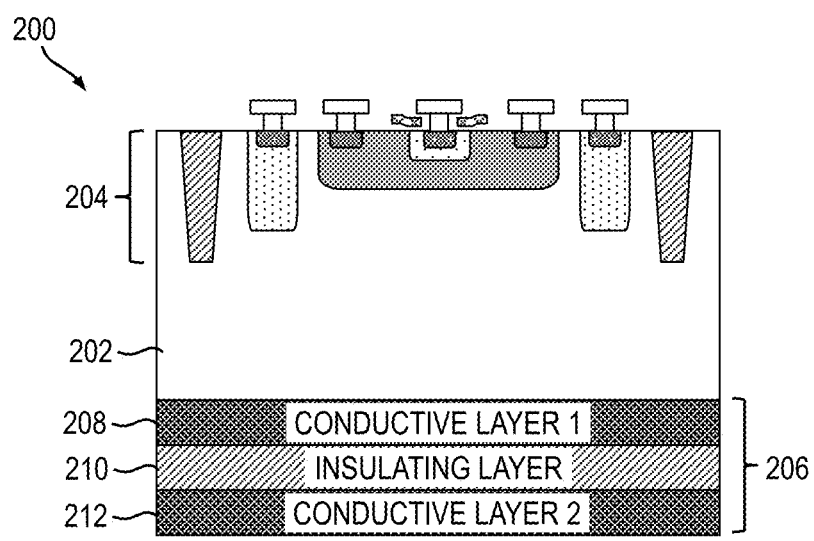
FIG. 2 is a cross-sectional view depicting at least a portion of an exemplary semiconductor structure including at least one metal-oxide-semiconductor field-effect transistor (MOSFET) device integrated with a single back-side capacitor, according to one or more embodiments of the present invention.

FIG. 2 is a cross-sectional view depicting at least a portion of an exemplary semiconductor structure 200 including at least one MOSFET device integrated with a single back-side capacitor, according to one or more embodiments of the invention. The MOSFET device(s) and integrated capacitor are formed using lateral MOS technology, in one or more embodiments. With reference to FIG. 2, the structure 200 comprises a substrate 202 having an active layer 204 in which one or more MOSFET devices are formed proximate an upper surface of the substrate. The structure 200 further includes an integrated capacitor 206 disposed on a back-side of the substrate 202.

Integrating the input capacitor with the power devices in this manner advantageously eliminates the need for an external input capacitor, which in turn eliminates (or at least reduces) parasitic inductance and resistance between the input capacitor and the power devices, thereby providing a more stable input voltage and better voltage spike suppression, among other benefits. The integrated capacitor can be fabricated using a simple growth process and is therefore well-suited for integration using standard lateral MOS technology. Furthermore, since the input capacitor is formed on the back-side of the substrate, it does not consume significant additional chip area.

In this illustrative embodiment, the capacitor 206 includes a first conductive layer 208 formed on the back-side of the substrate 202, a dielectric layer 210 formed on a surface of the first conductive layer opposite the back-side of the substrate, and a second conductive layer 212 formed on a surface of the dielectric layer opposite the first conductive layer. The first and second conductive layers 208, 212 are preferably formed of a metal (e.g., aluminum, titanium or TiN), although embodiments of the invention are not limited to any specific conductive material(s). Furthermore, the first and second conductive layers 208, 212 may, in some embodiments, be formed of different materials. The dielectric layer 210, which is configured to electrically isolate the first and second conductive layers from one another, is preferably formed of an oxide (e.g., silicon dioxide or the like) or silicon nitride, or other dielectric/insulating materials with higher dielectric constants, although embodiments of the invention are not limited to any specific insulating material(s).

FIG. 3 is a flow diagram depicting at least a portion of an exemplary method 300 for fabricating a semiconductor structure including at least one MOSFET device and a back-side integrated input capacitor, according to one or more embodiments of the invention. FIGS. 4A through 4D are cross-sectional views depicting at least a portion of intermediate steps in the illustrative fabrication method 300 shown in FIG. 3, according one or more embodiments of the invention.

Figure 4A:
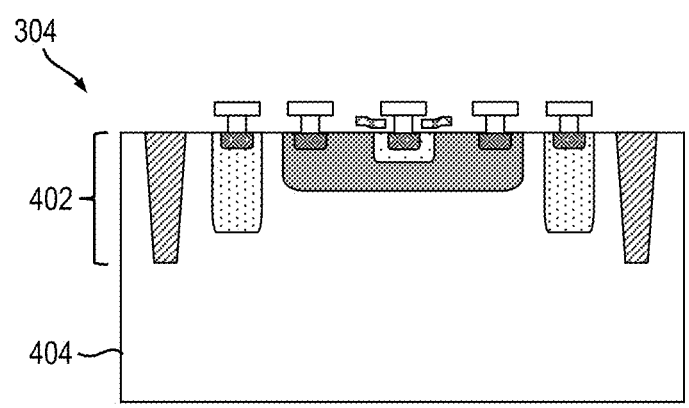
FIGS. 4A through 4D are cross-sectional views depicting at least a portion of intermediate steps in the illustrative fabrication method shown in FIG. 3, according one or more embodiments of the present invention.

With reference now to FIG. 3, the method 300 begins in step 302 by performing certain initial processing (e.g., photolithography, etching, deposition, etc.) typically employed in forming an active layer, such as active layer 402 shown in FIG. 4A, in an upper surface of a semiconductor substrate, such as substrate 404 shown in FIG. 4A. At least one MOSFET device, and more preferably at least high-side and low-side MOSFET devices for use in a power management circuit (e.g., 100 shown in FIG. 1) or similar application, are manufactured in step 304.

Figure 4B:
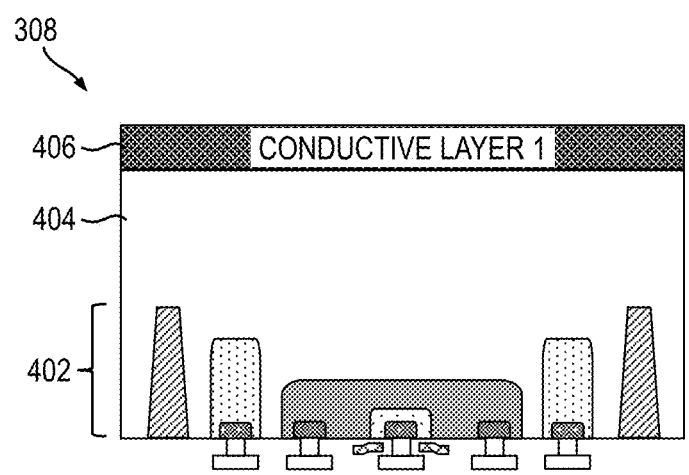
Figure 4C:
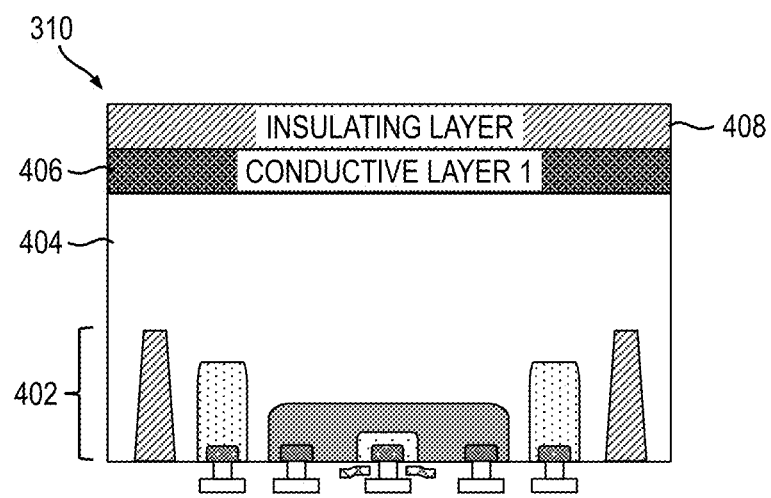

In step 306, the wafer is flipped upside down, so that the active layer 402 is downwardly disposed and a back-side of the substrate 404 is upwardly disposed, as depicted in FIG. 4B. A first conductive layer, such as conductive layer 406 shown in FIG. 4B, is formed on the back-side of the substrate (404 in FIG. 4B) in step 308. The first conductive layer (406 in FIG. 4B) may be formed using a standard deposition process (e.g., metal vapor deposition, silicide process, etc.), in one or more embodiments. In some embodiments, the first conductive layer 406 may be formed in the substrate by doping a back-side surface of the substrate 404 with an impurity having a prescribed doping concentration (e.g., using ion implantation or the like), so that the substrate, at least proximate the back-side surface, has a low resistivity (e.g., 0.001 to 10 ohm-cm). In step 310, an insulating layer, such as insulating layer 408 shown in FIG. 4C, is formed on an upper surface of the first conductive layer 406. The insulating layer 408, which may comprise an oxide or other dielectric material, is preferably formed using a chemical vapor deposition (CVD) or physical vapor deposition (PVD) process, etc.

Figure 4D:
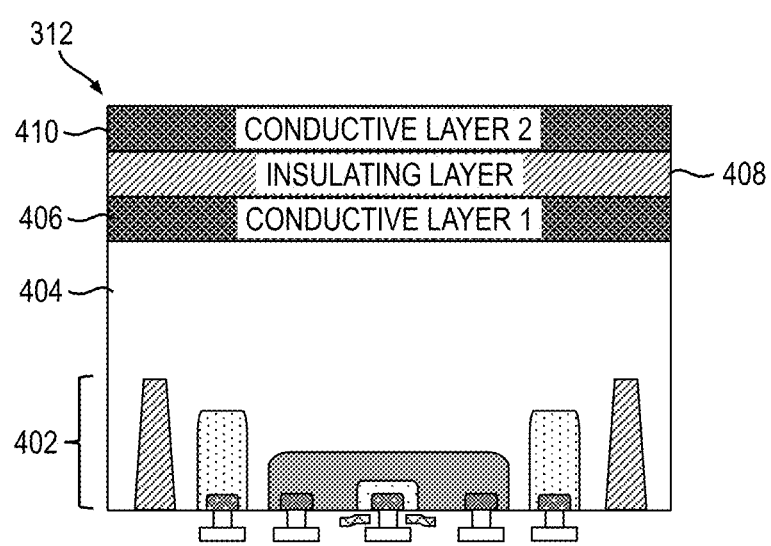

In step 312, a second conductive layer, such as conductive layer 410 depicted in FIG. 4D, is formed on an upper surface of the insulating layer 408. The second conductive layer may be formed using a process consistent with that used to form the first conductive layer (e.g., metal deposition), although embodiments of the invention are not limited to any specific process or material(s) used to form the second conductive layer. As previously stated, the first and second conductive may be formed of different materials, and therefore the processes used to form the first and second conductive may also be different, in one or more embodiments. The fabrication method 300 ends at step 314, which may include back-end-of line (BEOL) processing to form electrical interconnects to the integrated capacitor.

Figure 5:
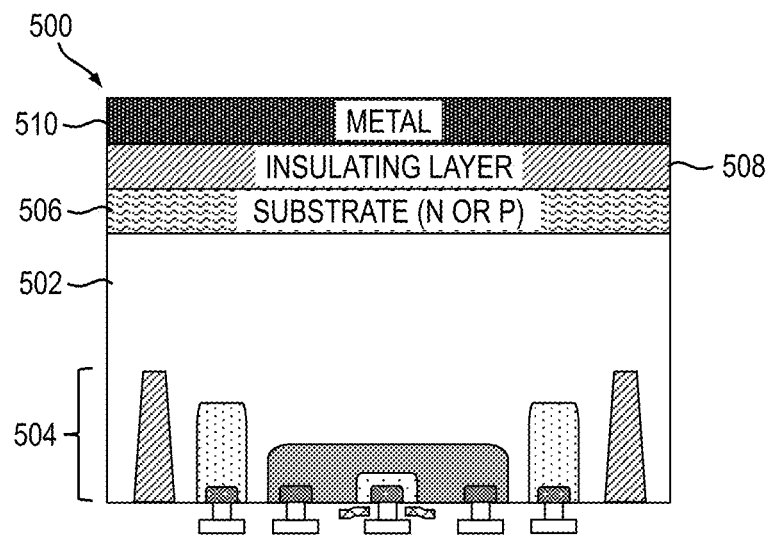
FIG. 5 is a cross-sectional view depicting at least a portion of an exemplary semiconductor structure comprising a single back-side capacitor integrated with an MOS structure, in which the single integrated capacitor comprises a first conductive layer formed on the substrate of one chip, and a second conductive layer formed of a metal film, respectively, according to one or more embodiments of the present invention.
Figure 6:
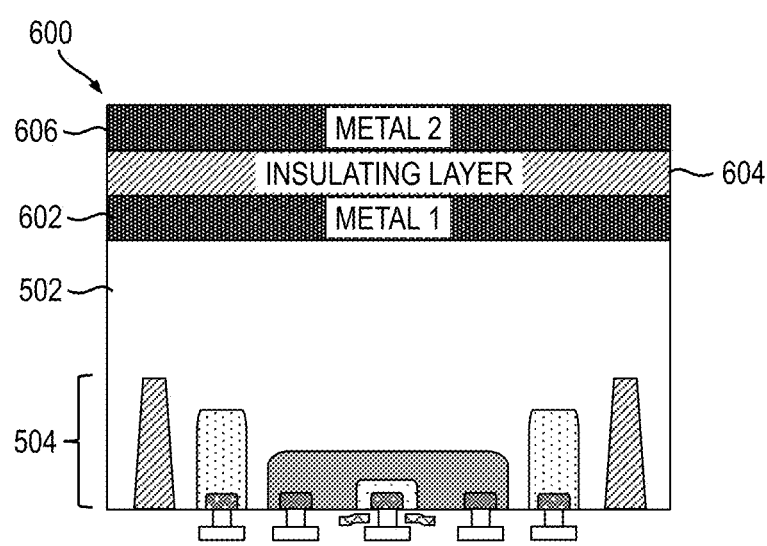
FIG. 6 is a cross-sectional view depicting at least a portion of an exemplary semiconductor structure, consistent with the illustrative semiconductor structure shown in FIG. 5, in which the single integrated capacitor comprises first and second conductive layers formed of different metals, according to one or more embodiments of the present invention.
Figure 7:
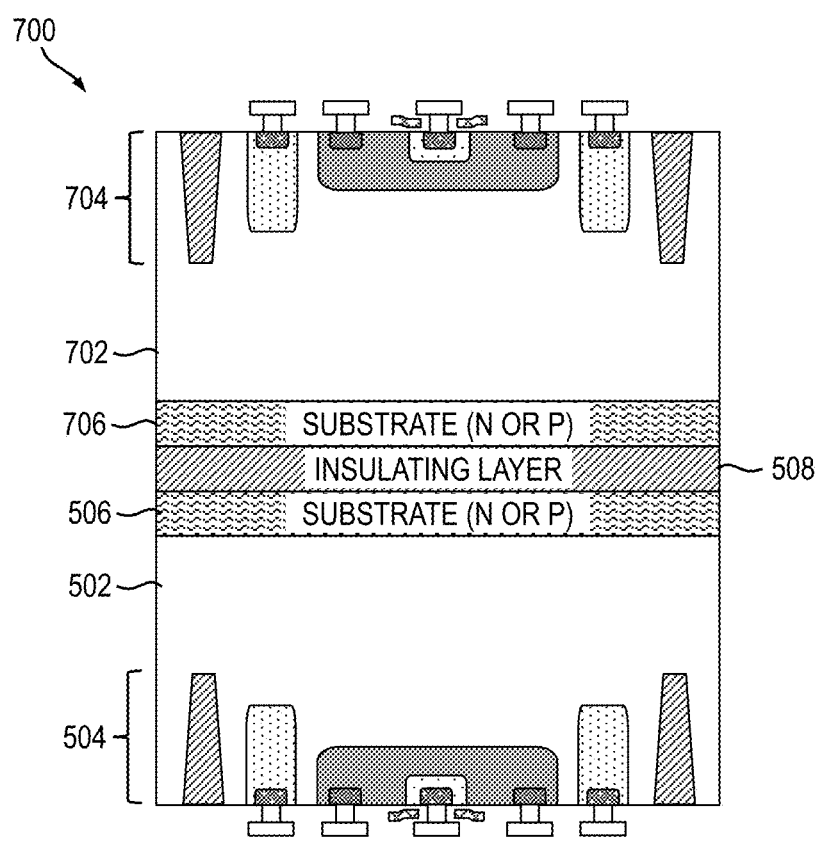
FIG. 7 is a cross-sectional view depicting an exemplary structure including a single integrated capacitor formed between two stacked semiconductor structures, in which the single integrated capacitor comprises a first conductive layer formed on the substrate of a first chip and a second conductive layer formed on the substrate of a second chip, respectively, according to one or more embodiments of the present invention.

By way of example only and without limitation, FIGS. 5 through 7 are cross-sectional views depicting some ways in which an illustrative single integrated capacitor can be formed, according to embodiments of the invention. As will become apparent to those skilled in the art given the teachings herein, there various other ways of integrating a capacitor with an MOS structure that are similarly contemplated and within the scope of the present invention.

FIG. 5 is a cross-sectional view depicting at least a portion of an exemplary semiconductor structure 500 comprising a single back-side capacitor integrated with an MOS structure, according to one or more embodiments. The semiconductor structure 500 includes a semiconductor structure 502, such as doped silicon, having an active layer 504 in which one or more MOSFET devices are formed proximate an upper surface of the substrate. In manufacturing, the semiconductor structure 500 is flipped upside-down and the integrated capacitor is formed on a back-side of the substrate 502, opposite the active layer 504. In the illustrative semiconductor structure 500, the integrated capacitor includes a first conductive layer 506, which in this embodiment is formed as a portion of the back-side of the substrate 502. In forming the first conductive layer 506, at least a portion of the back-side of the substrate 502 is doped with an n-type or p-type impurity of a prescribed doping concentration level to thereby lower a resistivity of the back-side portion of the substrate. This eliminates a deposition step otherwise required to form the first conductive layer using a material that is different than the substrate, such as a metal.

The integrated capacitor further includes an insulating layer 508 formed on an upper surface of the first conductive layer 506. The insulating layer 508 can be formed, in one or more embodiments, using thermal oxidation or a deposition process, as previously stated. A second conductive layer 510 is formed on at least a portion of an upper surface of the insulating layer 508. In this embodiment, the second conductive layer 510 preferably comprises a metal and may be formed using a deposition or similar process. The second conductive layer 510 may be formed, in one or more embodiments, during BEOL processing of the structure 500.

FIG. 6 depicts an exemplary embodiment in which the single integrated capacitor comprises first and second conductive layers formed of different metals, according to one or more embodiments of the invention. Specifically, with reference to FIG. 6, a semiconductor structure 600 includes a first conductive layer 602 disposed on the back-side of the substrate 502, opposite the active layer 504. In this embodiment, the first conductive layer 602 comprises a first metal material, which may be formed using a deposition process (e.g., metal deposition) on at least a portion of the back-side of the substrate 502. An insulating layer 604 is then formed on at least a portion of an upper surface of the first conductive layer 602. Like the insulating layer 508 shown in FIG. 5, the insulating layer 604 may be formed using, for example, thermal oxidation or a deposition process. A second conductive layer 606, which in this embodiment comprises a second metal material, is disposed on at least a portion of an upper surface of the insulating layer 604. The second metal material used in the second conductive layer 606 may be the same as the first metal material forming the first conductive layer 602, or a different metal material may be employed. The first and second conductive layers 602, 606 may be formed, in one or more embodiments, during BEOL processing of the structure 600.

FIG. 7 is a cross-sectional view depicting an exemplary structure 700 including a single integrated capacitor formed between two stacked semiconductor structures, according to one or more embodiments of the invention. With reference to FIG. 7, the structure 700 includes a first substrate 502 having a first active layer 504 in which one or more MOSFET devices are formed proximate an upper surface of the first substrate. The first substrate is preferably flipped upside-down, such that a back-side of the first substrate is facing upwards as shown.

Consistent with the illustrative integrated capacitor embodiment shown in FIG. 5, a first conductive layer 506, implementing a first plate of the integrated capacitor, is formed as a portion of the back-side of the first substrate 502, such as by doping at least a portion of the back-side of the first substrate 502 with an n-type or p-type impurity having a prescribed doping concentration level (e.g., $1\times10^{15}$ to $1\times10^{19}$ cm$^{-3}$). Ion implantation, or a similar process, may be used to dope the back-side of the substrate 502. An insulating layer 508, which may comprise an oxide (e.g., silicon dioxide), is formed on at least a portion of an upper surface of the first conductive layer 506, such as by using, for example, thermal oxidation or a deposition process in a manner consistent with the formation of the insulating layer 508 and 604 shown in FIGS. 5 and 6, respectively.

The structure 700 further includes a second substrate 702 disposed on an upper surface of at least a portion of the insulating layer 508. The second substrate 702, similar to the first substrate 502, comprises a second active layer 704 in which one or more MOSFET devices are formed proximate an upper surface of the second substrate. At least a portion of a back-side of the second substrate 702 is disposed on the upper surface of the insulating layer 508 and forms a second conductive layer 706, implementing a second plate of the integrated capacitor.

In one or more embodiments, the first and second substrates 502, 702 are part of first and second semiconductor dies that are stacked such that their back-side surfaces face one another and are separated by the insulating layer 508, which is sandwiched therebetween. For example, the first die may comprise power MOSFET devices fabricated using DMOS technology and the second die may comprise driver circuitry fabricated using low-voltage CMOS technology. Formed in this manner, the area between the two stacked dies is advantageously used to implement the integrated capacitor without consuming additional chip area. The insulating layer may comprise epoxy or adhesive film or other standard die attach materials. In this regard, the second die is formed separately from the first die and stacked together during packaging processing, in one or more embodiments.

Figure 8:
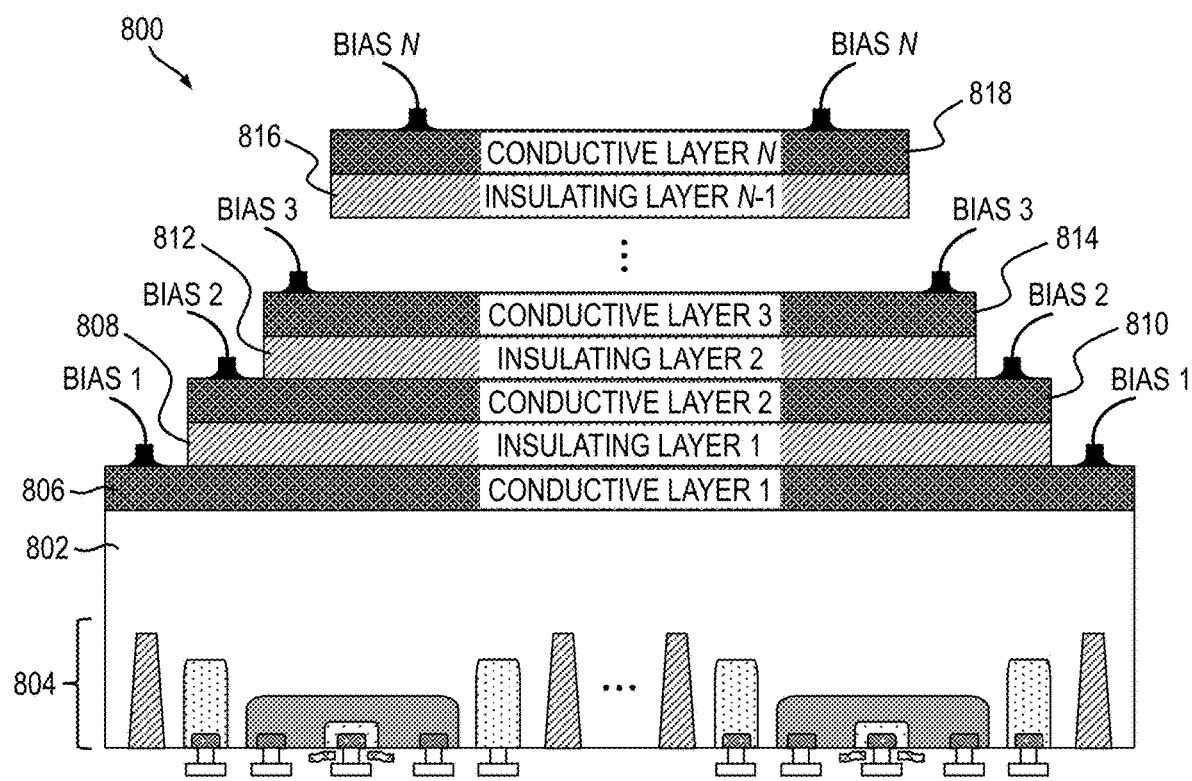
FIG. 8 is a cross-sectional view depicting at least a portion of an exemplary semiconductor structure including at least one MOSFET device integrated with multiple back-side capacitors, with each of the multiple back-side capacitors capable of being biased to a different voltage based on the circuit application, according to one or more embodiments of the present invention.

Although various exemplary embodiments have been described in connection with FIGS. 5-7 which employ a single integrated capacitor, these same steps can be extended to form multiple integrated capacitors, according to one or more embodiments of the invention. By way of example only and without limitation, FIG. 8 is a cross-sectional view depicting at least a portion of an exemplary semiconductor structure 800 including at least one MOSFET device integrated with multiple back-side capacitors, according to one or more embodiments of the invention. In a manner consistent with the semiconductor structure 200 shown in FIG. 2, the MOSFET device(s) and integrated capacitors are preferably formed using lateral MOS technology, in one or more embodiments.

With reference now to FIG. 8, the semiconductor structure 800 comprises a substrate 802 having an active layer 804 in which one or more MOSFET devices are formed proximate an upper surface of the substrate. The structure 800 further includes multiple integrated capacitors, formed using alternating conductive layers and insulating layers, disposed on a back-side of the substrate 802. Specifically, a first conductive layer 806 is formed on at least a portion of a back-side of the substrate 802, such as by using a deposition process or the like.

A first insulating layer 808 is formed on an upper surface of the first conductive layer 806 (i.e., the surface opposite the substrate), such as by using thermal oxidation, CVD or PVD deposition, etc. The first insulating layer 808 preferably has a lateral width that is less than a lateral width of the first conductive layer 806 to allow for the formation of one or more conductive terminals (e.g., metal) for connecting the first conductive layer to a first bias source (BIAS 1).

Similarly, a second conductive layer 810 may be formed on at least a portion of an upper surface of the first insulating layer 808. A second insulating layer 812 is then formed on an upper surface of the second conductive layer 810, such as by using thermal oxidation, deposition or the like. The second insulating layer 812 preferably has a lateral width that is less than a lateral width of the second conductive layer 810 to allow for the formation of one or more conductive terminals for electrically connecting the second conductive layer to a second bias source (BIAS 2). A third conductive layer 814 is formed on at least a portion of an upper surface of the second insulating layer 812, preferably in a manner consistent with the formation of the first and second conductive layers 806, 810. One or more conductive terminals formed on an upper surface of the third conductive layer 814 provides electrical connection to a third bias source (BIAS 3).

Extending this same methodology generally to multiple integrated capacitors comprising N conductive layers, where N is an integer, an $(N-1)^{th}$ insulating layer 816 is formed on an upper surface of an $(N-1)^{th}$ conductive layer (not explicitly shown, but implied). As with the other insulating layers 808, 812 in the semiconductor structure 800, the $(N-1)^{th}$ insulating layer 816 preferably has a lateral width that less than a lateral width of the $(N-1)^{th}$ conductive layer on which it is disposed to allow for the formation of one or more conductive terminals for electrically connecting the $(N-1)^{th}$ conductive layer to a corresponding $(N-1)^{th}$ bias source. An $N^{th}$ conductive layer 818 is then formed on at least a portion of an upper surface of the $(N-1)^{th}$ insulating layer 816. One or more conductive terminals are formed on an upper surface of the $N^{th}$ conductive layer 818 for electrically connecting the $N^{th}$ conductive layer 818 to an $N^{th}$ bias source (BIAS N).

The first conductive layer 806 forms a first plate of a first integrated capacitor. A second plate of the first integrated capacitor and a first plate of a second integrated capacitor are shared by the common second conductive layer 810. Likewise, a second plate of the second integrated capacitor and a first plate of a third integrated capacitor are shared by the common third conductive layer 814; and so on. Each layer of capacitor can be connected to a separate bias source as shown. Alternatively, two or more multilayer capacitors can be connected together in parallel to form a larger capacitor. For example, Bias 1, Bias 3 and Bias N can be connected to VDD, and Bias 2, Bias 4 and Bias (N–1) can be connected to ground, in one or more embodiments.

Each of the insulating layers 808, 812, 816 in the semiconductor structure 800 preferably comprises an oxide (e.g., silicon dioxide) or other dielectric material (e.g., nitride, etc.); the insulating layers may all be formed of the same material or, alternatively, one or more insulating layers may be formed of different materials. Similarly, each of the conductive layers 806, 810, 814, 818 comprises an electrically conductive material, such as, but not limited to, metal, polysilicon, doped silicon, etc. In one or more embodiments, all of the conductive layers in the semiconductor structure 800 are formed of the same material; in other embodiments, one or more of the conductive layers may be formed of a different material(s), as will become apparent to those skilled in the art given the teachings herein.

Figure 9A:
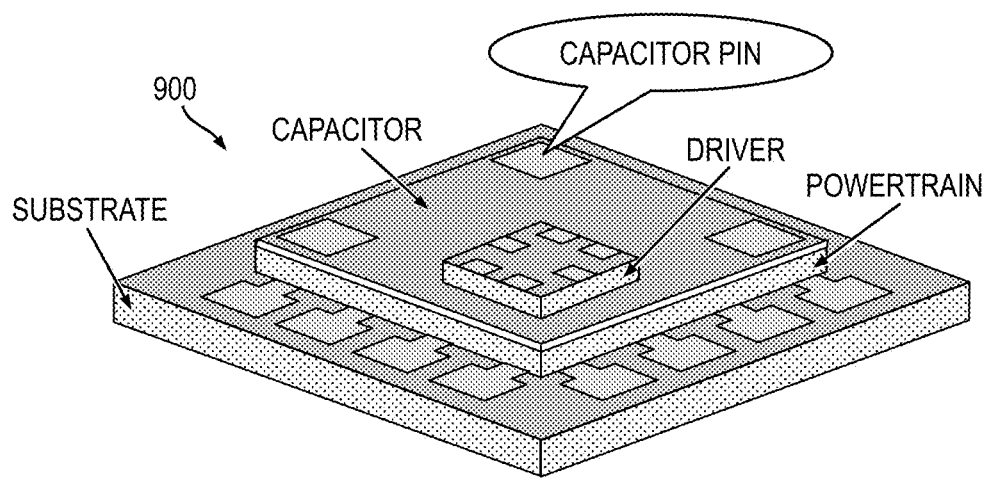
FIG. 9A is a top perspective view.
Figure 9B:
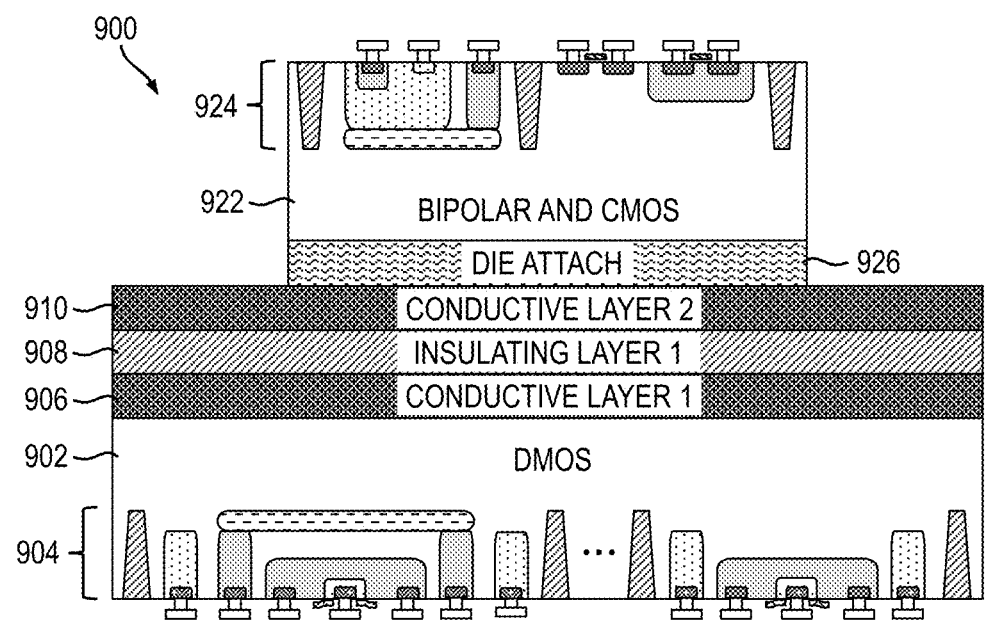
FIGS. 9B and 9C are cross-sectional views, respectively, of a stacked power management module including at least one integrated capacitor, according to one or more embodiments of the present invention.
Figure 9C:
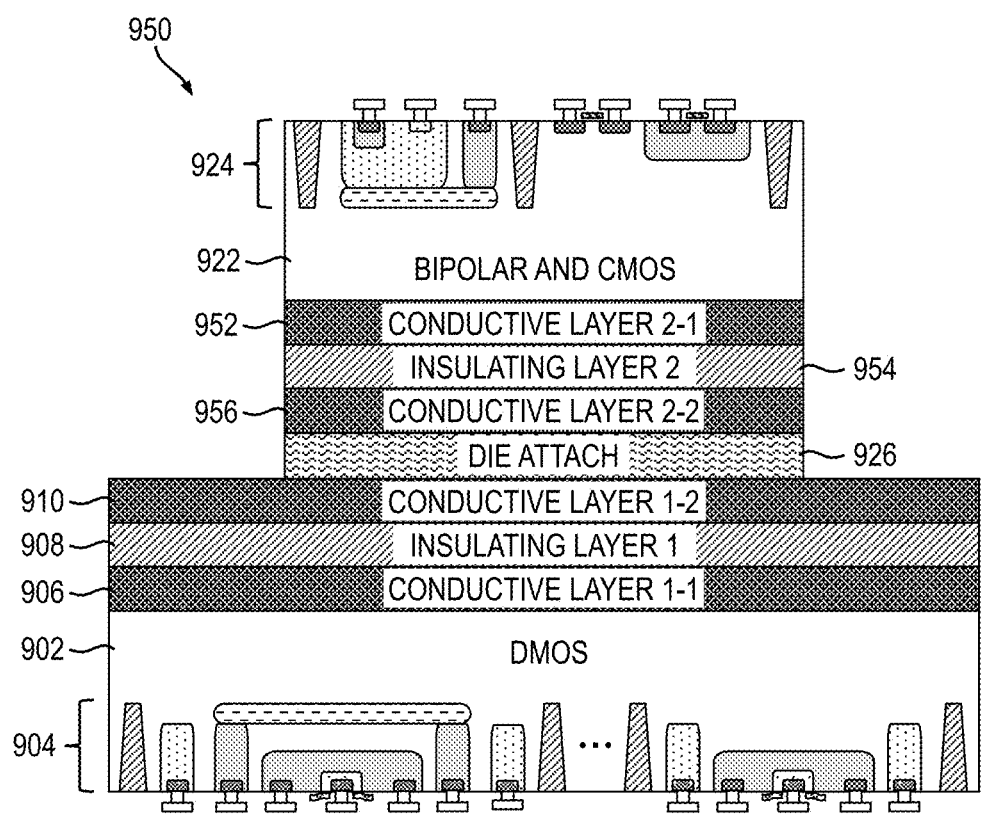

As previously stated, embodiments of the invention are well-suited for use in a system application, such as, for example, a DC-DC converter, in which at least a first die including circuitry (e.g., driver circuitry) fabricated using bipolar and/or CMOS technology is integrated with at least a second die including one or more power devices and/or circuitry fabricated using DMOS technology. FIG. 9A is a top perspective view, and FIGS. 9B and 9C are cross-sectional views, respectively, of a stacked power management module including at least one integrated capacitor, according to one or more embodiments of the present invention. The power management module 900 includes a driver chip, which may be fabricated using low-voltage bipolar and/or CMOS technology, and a powertrain chip (e.g., power MOSFET device(s)) fabricated using high-voltage DMOS technology. The driver chip and powertrain chip are configured as a stacked structure disposed on an upper surface of a substrate or interposer. As shown in FIG. 9A, at least one integrated capacitor is formed on a back-side of the powertrain chip, in a manner consistent with the single- and multiple-integrated capacitors previously described in conjunction with FIGS. 5-8.

In one or more embodiments, a first plate of the integrated capacitor may be formed as a portion of the back-side of the substrate (e.g., 902 in FIG. 9B) of the powertrain chip, such as by doping at least a portion of the back-side of the substrate with an n-type or p-type impurity having a prescribed doping concentration level, consistent with the integrated capacitor shown in FIG. 5. This doped portion of the back-side of the substrate of the powertrain chip essentially forms the first conductive layer 906 shown in FIG. 9B. A second conductive layer of the integrated capacitor (e.g., 910 in FIG. 9B) preferably comprises a metal. In one or more embodiments, a connection terminal to the first plate of the integrated capacitor shares the same pad with the corresponding terminal (e.g., GND) of the powertrain chip, which is placed on the bottom pad of powertrain chip and is not explicitly shown in FIGS. 9A-18 (e.g., 1004 in FIG. 10). Alternatively, it is contemplated that the first plate of the integrated capacitor can be connected to other terminals, such as, for example, a bootstrap capacitor. The pad labeled "capacitor pin" is terminal providing electrical connection to the second plate (e.g., second conductive layer 910 in FIG. 9B) of the integrated capacitor.

FIG. 9B depicts an exemplary embodiment in which a driver chip without an integrated capacitor is disposed on a powertrain chip with an integrated capacitor, according to one or more embodiments of the invention. With reference to FIG. 9B, the powertrain chip in the power management module 900 includes a substrate 902 (e.g., silicon, germanium, gallium arsenide, etc.) having an active layer 904 in which one or more power MOSFET devices (e.g., laterally-diffused MOS (LDMOS) devices) are formed proximate an upper surface of the substrate. During manufacturing, the powertrain chip is oriented upside-down (i.e., with the active layer 904 facing down) and at least one integrated capacitor is formed on a back-side of the substrate 902, opposite the active layer 904.

In the illustrative power management module 900, the integrated capacitor includes a first conductive layer 906 formed on at least a portion of a back-side of the substrate 902. In one or more embodiments, the first conductive layer 906 comprises a metal, formed using a metal deposition process or the like; in other embodiments, the first conductive layer 906 may be formed as a portion of the back-side of the substrate 902, such as by doping the back-side of the substrate with an n-type or p-type impurity of a prescribed doping concentration level and depth to lower a resistivity of the back-side portion of the substrate. The integrated capacitor further includes an insulating layer 908 formed on an upper surface of the first conductive layer 906. In one or more embodiments, the insulating layer 908 comprises an oxide, which may be formed using thermal oxidation or a deposition process. A second conductive layer 910 is formed on at least a portion of an upper surface of the insulating layer 908. In one or more embodiments, the second conductive layer 910 comprises a metal, which may be formed using a deposition or similar process. The first and second conductive layers may comprise the same material (e.g., metal) or, in some embodiments, may be formed of different materials (e.g., metal and polysilicon). Although a single integrated capacitor is shown in FIG. 9B, it is to be appreciated that multiple integrated capacitors (e.g., consistent with the illustrative multiple integrated capacitor shown in FIG. 8) may be similarly employed.

With continued reference to FIG. 9B, the driver chip in the power management module 900 includes a substrate 922 (e.g., silicon, germanium, gallium arsenide, etc.) having an active layer 924 in which one or more bipolar and/or CMOS devices and/or circuits are formed proximate an upper surface of the substrate 922. After fabrication, the powertrain and driver chips are stacked with their respective back-side surfaces facing one another, in this illustrative embodiment, and with the integrated capacitor disposed between the stacked powertrain and driver chips. More particularly, the back-side of the substrate 922 of the driver chip is preferably attached to an upper surface of the second conductive layer 910. Attachment of the driver and powertrain chips may be made using a die attach layer 926 (e.g., epoxy, etc.) or similar means.

It is to be appreciated that in one or more alternative embodiments, the integrated capacitor may be formed on the back-side surface of the driver chip prior to attachment to the powertrain chip. In this scenario, the structure including the driver chip and integrated capacitor can be flipped upside-down such that the front-side (i.e., upper) conductive layer of the capacitor is attached to the back-side of the powertrain chip via the die attach layer 926. That is, the integrated capacitor need not be formed first on the back-side of the powertrain chip.

FIG. 9C depicts an exemplary power management module 950 in which a driver chip with a second integrated capacitor is disposed on a powertrain chip with a first integrated capacitor, according to one or more embodiments of the invention. Consistent with the illustrative integrated capacitor embodiment shown in FIG. 9B, the powertrain chip in the power management module 950 includes a substrate 902 having an active layer 904 in which one or more power MOSFET devices are formed proximate an upper surface of the substrate. Using the same or similar manufacturing process, the powertrain chip is flipped upside-down and at least one integrated capacitor is formed on a back-side of the substrate 902, opposite the active layer 904.

The structure of each of the first and second integrated capacitors is preferably consistent with the integrated capacitor shown in FIG. 9B. In the illustrative power management module 950, the first integrated capacitor includes a first conductive layer 906 formed on at least a portion of a back-side of the substrate 902, an insulating layer 908 formed on an upper surface of the first conductive layer 906, and a second conductive layer 910 formed on at least a portion of an upper surface of the insulating layer 908.

With continued reference to FIG. 9C, the driver chip in the power management module 950 includes a substrate 922 (e.g., silicon, germanium, gallium arsenide, etc.) having an active layer 924 in which one or more bipolar and/or CMOS devices and/or circuits are formed proximate an upper surface of the substrate 922. After fabrication, the powertrain and driver chips are stacked with their respective back-side surfaces facing one another, in this illustrative embodiment, and with the first and second integrated capacitors disposed between the stacked powertrain and driver chips.

The second integrated capacitor associated with the driver chip includes a first conductive layer 952 formed on at least a portion of a back-side of the substrate 922, an insulating layer 954 formed on an upper surface of the first conductive layer 952, and a second conductive layer 956 formed on at least a portion of an upper surface of the insulating layer 954, which is in a manner consistent with the formation of the layers 906, 908 and 910, respectively, of the first integrated capacitor associated with the powertrain chip.

The driver and powertrain chips, with their corresponding integrated capacitors, are stacked together to form the power module 950. More particularly, a front-side of the second conductive layer 956 of the second integrated capacitor disposed on the back-side of the substrate 922 of the driver chip is preferably attached to a front-side of the second conductive layer 910 of the first integrated capacitor of the powertrain chip. In one or more embodiments, attachment of the driver and powertrain chips may be made using a die attach layer 926 (e.g., epoxy, etc.), or similar means, disposed between the front-side surfaces of the first and second integrated capacitors, as shown.

Electrical connection between the devices and/or circuits on the driver chip and powertrain chip can be made using several contemplated approaches, including through-silicon vias (TSVs), bond wires, solder bumps/controlled collapse chip connection (C4) connections, etc., as will be described in further detail in conjunction with the illustrative embodiments shown in FIGS. 10-18. Moreover, in one or more other embodiments, the driver and powertrain chips are not necessarily attached with their respective back-sides facing one another, as will be described in further detail herein below.

FIGS. 10-18 are top perspective views depicting at least a portion of an exemplary power management module in various orientations and connection arrangements of driver and powertrain chips, according to illustrative embodiments of the invention; FIGS. 10-14 depict exemplary orientations of the powertrain chip, integrated capacitor and driver chip, and FIGS. 15-18 depict exemplary connection arrangements between the integrated capacitor, powertrain chip and driver chip, and a carrier (e.g., interposer) or other substrate. The orientations and connection arrangements are shown in FIGS. 10-18 by way of example only and are not intended to be limiting. Other arrangements of the power management module not explicitly shown herein are similarly contemplated and are within the scope of the present invention, as will become apparent to those skilled in the art given the teachings herein.

Figure 10:
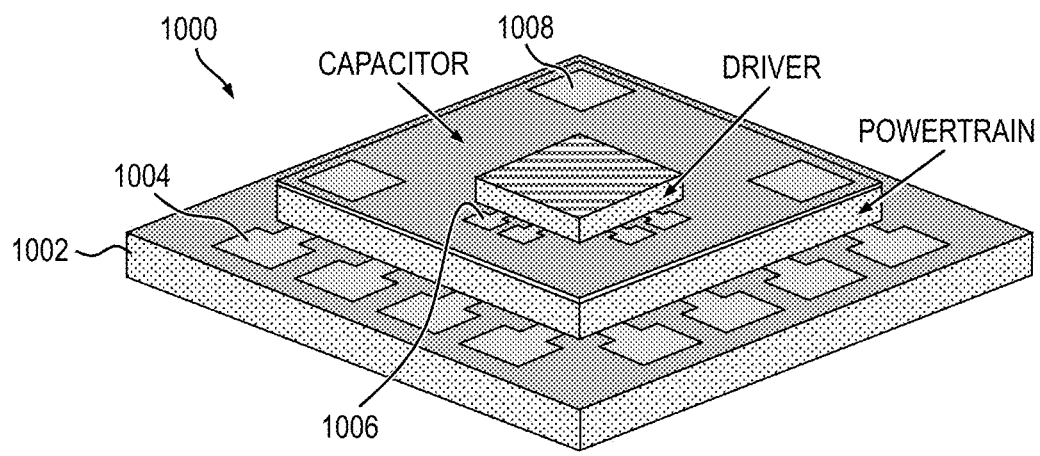
FIGS. 10-14 are top perspective views depicting at least a portion of an exemplary power management module in various illustrative orientations of driver and powertrain chips, according to illustrative embodiments of the present invention.

Referring now to FIG. 10, a top perspective view of at least a portion of an exemplary power management module 1000 is shown, according to one or more embodiments of the invention. The power management module 1000 includes a driver chip, which may be fabricated using bipolar and/or CMOS technology, a powertrain chip, which may be fabricated using DMOS technology, and an integrated capacitor disposed between the driver and powertrain chips. In this embodiment, the power management module 1000 includes a carrier (e.g., interposer) or substrate 1002, which may be formed of a rigid material (e.g., silicon, etc.) having a plurality of conductive pads 1004 disposed on an upper surface of the substrate. The powertrain chip is oriented face down, so that connection structures (e.g., solder bumps, etc.) formed on a front-side of the powertrain chip (not explicitly shown, but implied) are aligned with corresponding pads 1004 formed on the substrate 1002 for providing electrical connection to devices and/or circuitry formed in an active layer of the powertrain chip, proximate the front-side of the powertrain chip.

The integrated capacitor is disposed on at least a portion of a back-side of the powertrain chip. The integrated capacitor may be formed in a manner consistent with the integrated capacitor described herein above, for example as shown in FIGS. 9A and 9B. Conductive pads 1004 disposed on an upper surface of the substrate and conductive pads 1008 formed on the back-side of the powertrain chip provide electrical connection to first and second conductive layers, respectively, of the integrated capacitor.

The driver chip in the power management module 1000 is oriented face down in this illustrative embodiment, such that connection structures (e.g., solder bumps, etc.) formed on front-side of the driver chip (not explicitly shown, but implied) are aligned with corresponding conductive pads 1006 formed on the back-side of the powertrain chip, for providing electrical connection to the driver chip (e.g., between the driver chip and the powertrain chip and/or between the driver chip and the integrated capacitor), such as by using solder bumps, bond wires or through-silicon vias (TSVs), etc., not explicitly shown in FIG. 10. The driver chip may be attached to the powertrain chip using various known attachment means, such as, for example, a die attach layer (e.g., epoxy, solder, etc.).

Figure 11:
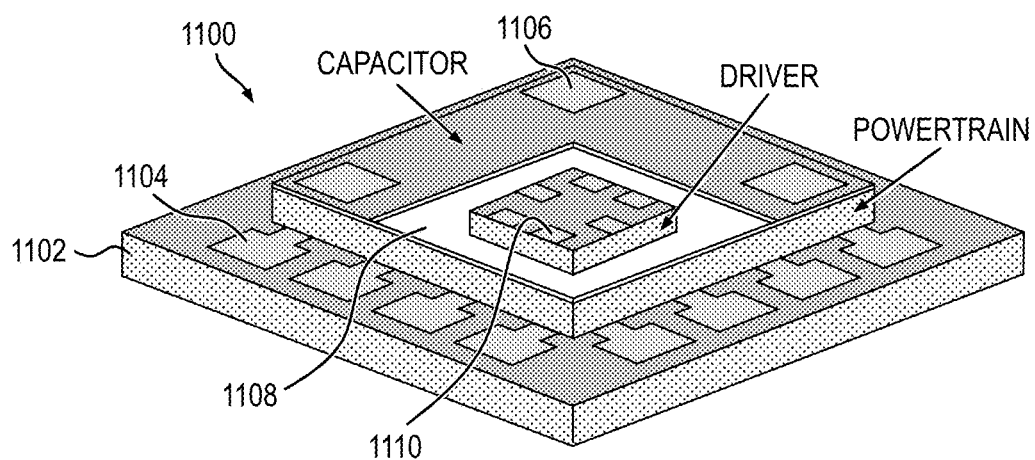

FIG. 11 is a top perspective view depicting at least a portion of an exemplary power management module 1100, according to one or more alternative embodiments of the invention. Like the illustrative power management module 1000 shown in FIG. 10, the power management module 1100 includes a driver chip, which may be fabricated using bipolar and/or CMOS technology, a powertrain chip, which may be fabricated using DMOS technology, and an integrated capacitor disposed between the driver and powertrain chips. In this embodiment, the power management module 1100 includes a carrier or substrate 1102, which may be formed of a multi-layered PCB or laminate materials (e.g., silicon, etc.) having a plurality of conductive pads 1104 disposed on an upper surface of the substrate. It is to be appreciated that the substrate 1102 may comprise an electrical PCB, an interposer used by TSVs, or other materials that can be used to realize the electrical connection between the powertrain chip and the driver chip, in accordance with embodiments of the invention. The powertrain chip is oriented face down, so that connection structures (e.g., solder bumps, etc.) formed on a front-side of the powertrain chip (not explicitly shown, but implied) are aligned with corresponding pads 1104 formed on the substrate 1102 for providing electrical connection to devices and/or circuitry formed in an active layer proximate the upper surface of the powertrain chip.

The integrated capacitor is disposed on at least a portion of a back-side of the powertrain chip. The integrated capacitor may be formed in a manner consistent with the integrated capacitor described herein above, for example as shown in FIGS. 9A and 9B. Conductive pads 1106 formed on the back-side of the powertrain chip provide electrical connection to a top conductive layer of the integrated capacitor. In this embodiment, the top conductive layer of the integrated capacitor does not completely cover the back-side of the powertrain chip, but is rather formed as a L-shaped structure, leaving a region 1108 on the back-side of the powertrain chip, in which the driver chip is disposed, devoid of the integrated capacitor.

In this embodiment, the driver chip is oriented face up and disposed on the back-side of the powertrain chip in the region 1108, such that a back-side of the driver chip and the back-side of the powertrain chip are facing one another. The driver chip may be attached to the powertrain chip using various known attachment means, such as, for example, a die attach layer (e.g., epoxy, solder, etc.). Conductive pads 1110 formed on an upper surface of the driver chip provide electrical connection to devices and/or circuitry formed in an active layer of the driver chip (e.g., between the driver chip and the powertrain chip and/or between the driver chip and the integrated capacitor), such as by using solder bumps, bond wires, TSVs, etc., not explicitly shown in FIG. 11.

Figure 12:
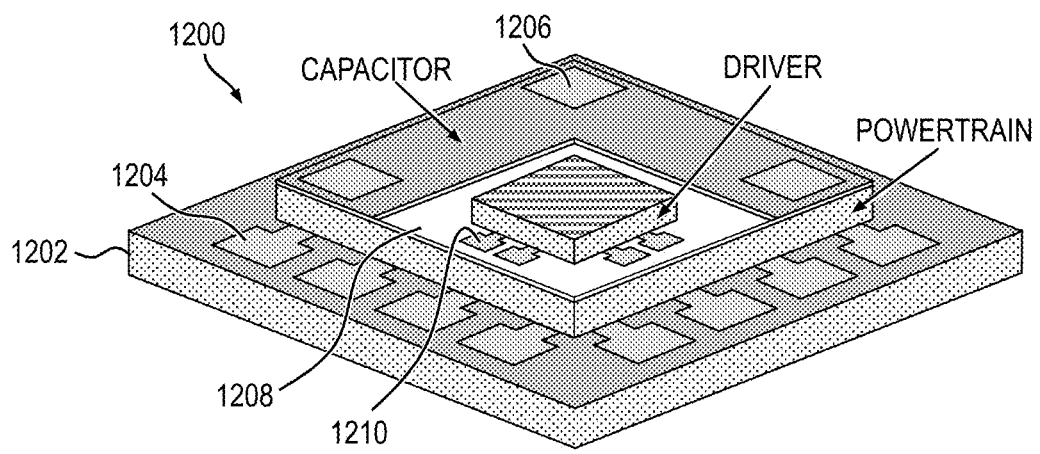

FIG. 12 is a top perspective view depicting at least a portion of an exemplary power management module 1200, according to one or more alternative embodiments of the invention. The power management module 1200 includes a driver chip, which may be fabricated using bipolar and/or CMOS technology, a powertrain chip, which may be fabricated using DMOS technology, and an integrated capacitor disposed between the driver and powertrain chips. In this embodiment, the power management module 1200 includes a carrier or substrate 1202, which may be formed of a rigid material (e.g., silicon, etc.) having a plurality of conductive pads 1204 formed on an upper surface of the substrate. The powertrain chip, in this exemplary embodiment, is oriented face down, so that connection structures (e.g., solder bumps, etc.) formed on a front-side of the powertrain chip (not explicitly shown, but implied) are aligned with corresponding pads 1204 formed on the substrate 1202 for providing electrical connection to devices and/or circuitry formed in an active layer proximate the front-side of the powertrain chip.

The integrated capacitor may be formed in a manner consistent with the integrated capacitor described herein above, for example as shown in FIGS. 9A and 9B. Conductive pads 1206 formed on the back-side of the powertrain chip provide electrical connection to a top conductive layer of the integrated capacitor. In this regard, the power management module 1200 is arranged similar to the illustrative power management module 1000 shown in FIG. 10, except that the integrated capacitor in the power management module 1200 is not formed over the entire back-side of the powertrain chip. Rather, the top conductive layer of the integrated capacitor is formed as a L-shaped structure, leaving a region 1208 on the back-side of the powertrain chip, in which the driver chip is disposed, devoid of the integrated capacitor.

In this embodiment, the driver chip is oriented face down and disposed on the back-side of the powertrain chip in the region 1208, such that a front-side of the driver chip is facing the back-side of the powertrain chip. Connection structures (e.g., solder bumps, etc.) formed on the front-side of the driver chip (not explicitly shown, but implied) are preferably aligned with corresponding conductive pads 1210 formed on the back-side of the powertrain chip, for providing electrical connection to the driver chip (e.g., between the driver chip and the powertrain chip and/or between the driver chip and the integrated capacitor), such as by using solder bumps, bond wires, TSVs, etc., not explicitly shown in FIG. 12. The driver chip may be attached to the powertrain chip using various known attachment means, such as, for example, a die attach layer (e.g., epoxy, solder, etc.).

Figure 13:
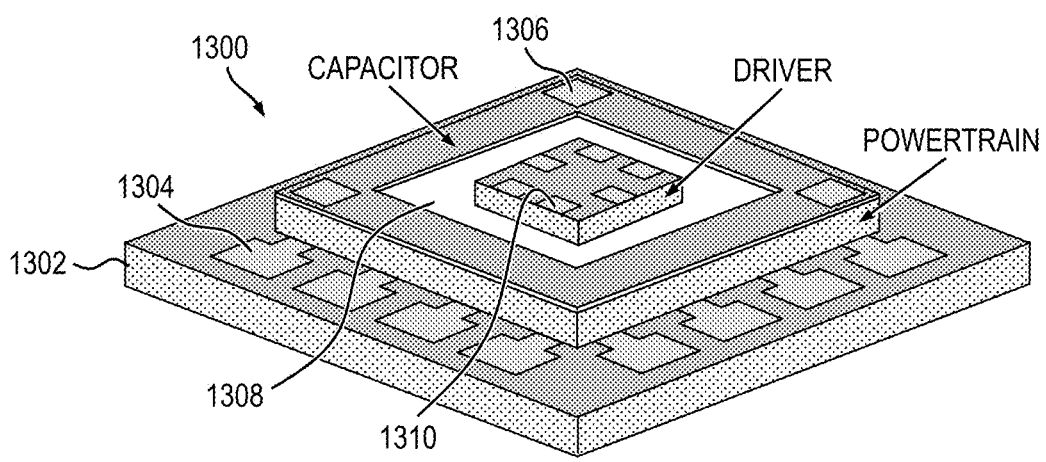

FIG. 13 is a top perspective view depicting at least a portion of an exemplary power management module 1300, according to one or more alternative embodiments of the invention. The power management module 1300 includes a driver chip, which may be fabricated using bipolar and/or CMOS technology, a powertrain chip, which may be fabricated using DMOS technology, and an integrated capacitor disposed between the driver and powertrain chips. In this embodiment, the power management module 1300 includes a carrier or substrate 1302, which may be formed of a rigid material (e.g., silicon, etc.) having a plurality of conductive pads 1304 disposed on an upper surface of the substrate. The powertrain chip is oriented face down, so that connection structures (e.g., solder bumps, etc.) formed on a front-side of the powertrain chip (not explicitly shown, but implied) are aligned with corresponding pads 1304 formed on the substrate 1302 for providing electrical connection to devices and/or circuitry formed in an active layer proximate the front-side of the powertrain chip.

The integrated capacitor is disposed on at least a portion of a back-side of the powertrain chip. The integrated capacitor may be formed in a manner consistent with the integrated capacitor described herein above, for example as shown in FIGS. 9A and 9B. Conductive pads 1306 formed on the back-side of the powertrain chip provide electrical connection to a top conductive layer of the integrated capacitor. In this embodiment, the top conductive layer of the integrated capacitor does not completely cover the back-side of the powertrain chip, but is rather formed as a donut-shaped structure surrounding a region 1308 on the back-side of the powertrain chip, in which the driver chip is disposed, which is devoid of the integrated capacitor.

In this embodiment, the driver chip is oriented face up and disposed on the back-side of the powertrain chip in the region 1308, such that a back-side of the driver chip and the back-side of the powertrain chip are facing one another. In this exemplary embodiment, the integrated capacitor entirely surrounds the driver chip. The driver chip may be attached to the powertrain chip using various known attachment means, such as, for example, a die attach layer (e.g., epoxy, solder, etc.). Conductive pads 1310 formed on a front-side of the driver chip provide electrical connection to devices and/or circuitry formed in an active layer of the driver chip (e.g., between the driver chip and the powertrain chip and/or between the driver chip and the integrated capacitor), such as by using solder bumps, bond wires, TSVs, etc., not explicitly shown in FIG. 13.

Figure 14:
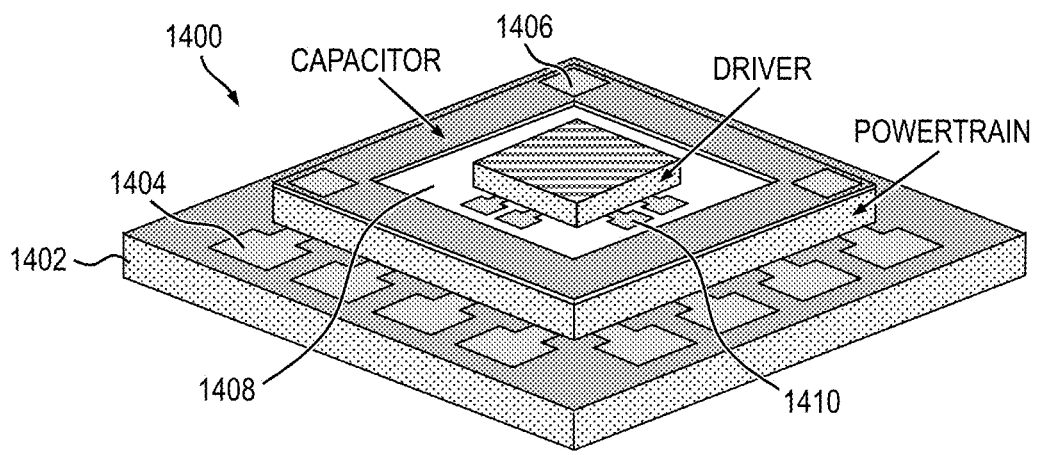

FIG. 14 is a top perspective view depicting at least a portion of an exemplary power management module 1400, according to one or more alternative embodiments of the invention. The power management module 1400 includes a driver chip, which may be fabricated using bipolar and/or CMOS technology, a powertrain chip, which may be fabricated using DMOS technology, and an integrated capacitor disposed between the driver and powertrain chips. In this embodiment, the power management module 1400 includes a carrier or substrate 1402, which may be formed of a rigid material (e.g., silicon, etc.) having a plurality of conductive pads 1404 disposed on an upper surface of the substrate. The powertrain chip is oriented face down, so that connection structures (e.g., solder bumps, etc.) formed on a front-side of the powertrain chip (not explicitly shown, but implied) are aligned with corresponding pads 1404 formed on the substrate 1402 for providing electrical connection to devices and/or circuitry formed in an active layer of the powertrain chip, proximate the front-side of the powertrain chip.

The integrated capacitor in the power management module 1400 is disposed on at least a portion of a back-side of the powertrain chip. The integrated capacitor may be formed in a manner consistent with the integrated capacitor shown in FIGS. 9A and 9B. Conductive pads 1306 formed on the back-side of the powertrain chip provide electrical connection to a top conductive layer of the integrated capacitor. In this embodiment, like the integrated capacitor in the illustrative power management module 1300 shown in FIG. 13, the top conductive layer of the integrated capacitor does not completely cover the back-side of the powertrain chip, but is rather formed as a donut-shaped structure surrounding a region 1408 on the back-side of the powertrain chip, in which the driver chip resides, which is devoid of the integrated capacitor.

In the exemplary power management module 1400, the driver chip is oriented face down and disposed on the back-side of the powertrain chip in the region 1408, such that a front-side of the driver chip is facing the back-side of the powertrain chip. Connection structures (e.g., solder bumps, etc.) formed on the front-side of the driver chip (not explicitly shown, but implied) are preferably aligned with corresponding conductive pads 1410 formed on the back-side of the powertrain chip, for providing electrical connection to the driver chip (e.g., between the driver chip and the powertrain chip and/or between the driver chip and the integrated capacitor), such as by using solder bumps, bond wires, TSVs, etc., not explicitly shown in FIG. 14. The driver chip may be attached to the powertrain chip using various known attachment means, such as, for example, a die attach layer (e.g., epoxy, solder, etc.).

Figure 15:
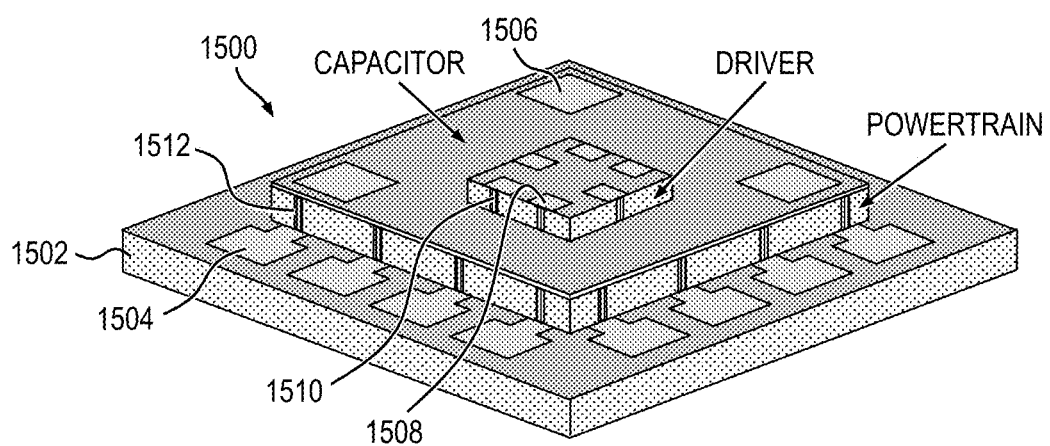
FIGS. 15-18 are top perspective views depicting at least a portion of an exemplary power management module with various illustrative connection arrangements between the integrated capacitor, powertrain chip and driver chip, and a carrier (e.g., interposer) or other substrate, according to illustrative embodiments of the present invention.

FIG. 15 is a top perspective view depicting at least a portion of a power management module 1500 showing an exemplary connection arrangement between a powertrain chip, a driver chip and an integrated capacitor, according to one or more embodiments of the invention. The power management module 1500 may be fabricated in a manner consistent with the illustrative power management module 900 shown in FIG. 9A.

Specifically, the power management module 1500 comprises a carrier or substrate 1502, which may be formed of a rigid material (e.g., silicon, etc.), having a plurality of conductive pads 1504 disposed on an upper surface of the substrate. The powertrain chip, in this embodiment, is oriented face down, so that connection structures (e.g., solder bumps, etc.) formed on an upper surface of the powertrain chip (not explicitly shown, but implied) are aligned with corresponding pads 1504 on the substrate 1502 for providing electrical connection to devices and/or circuitry formed in an active layer of the powertrain chip, proximate the upper surface of the powertrain chip.

The integrated capacitor in the power management module 1500 is disposed on at least a portion of a back-side of the powertrain chip. The integrated capacitor may be formed in a manner consistent with the integrated capacitor shown in FIGS. 9A and 9B. Conductive pads 1506 formed on the back-side of the powertrain chip provide electrical connection to a top conductive layer of the integrated capacitor. In this embodiment, like the integrated capacitor in the illustrative power management module 900 shown in FIG. 9A, the top conductive layer of the integrated capacitor completely covers the back-side of the powertrain chip, although in other embodiments, the integrated capacitor may be formed on only a portion of the back-side of the powertrain chip, so that there is a region on the back-side of the powertrain chip which is devoid of the integrated capacitor (e.g., as shown in FIGS. 11-14).

In one or more embodiments, the driver chip is oriented face up and disposed on the back-side of the powertrain chip, such that a back-side of the driver chip and the back-side of the powertrain chip are facing one another, as shown in FIG. 15. The driver chip may be attached to the powertrain chip using various known attachment means, such as, for example, a die attach layer (e.g., epoxy, solder, etc.). Conductive pads 1508 formed on an upper surface of the driver chip provide electrical connection on the upper surface of the driver chip to devices and/or circuitry formed in an active layer of the driver chip, between the driver chip and the powertrain chip, and/or between the driver chip and the integrated capacitor, using one or more TSVs 1510 formed through a substrate of the driver chip.

TSVs (e.g., 1510) are important in enabling technology for many heterogeneous integration (HI) systems as they are required for three-dimensional (3D) chip stacking in advanced microelectronic packaging approaches and have been recently used in many applications such as biomedical, optoelectronic, photonic, display technologies, and microelectromechanical systems (MEMSs). TSVs allow direct signal routing vertically between chips as opposed to routing to the periphery and wire bonding to an interposer or printed circuit board. This vertical routing results in shorter signal path lengths, which translates to improved high-frequency performance through reduced parasitic impedance and corresponding resistive-capacitive (RC) delays, among other benefits. In addition to electrical improvements, TSVs enable an increased number of inputs and outputs, since they can be arrayed throughout the area of a chip as opposed to utilizing only a periphery of the chip.

Similarly, one or more TSVs 1512 formed through the substrate of the powertrain chip provide electrical connection between devices and/or circuitry formed in an active layer of the powertrain chip and the driver chip, and/or between the powertrain chip and the integrated capacitor. The TSVs 1510, 1512 beneficially eliminate the need for bond wires or other connection means.

Figure 16:
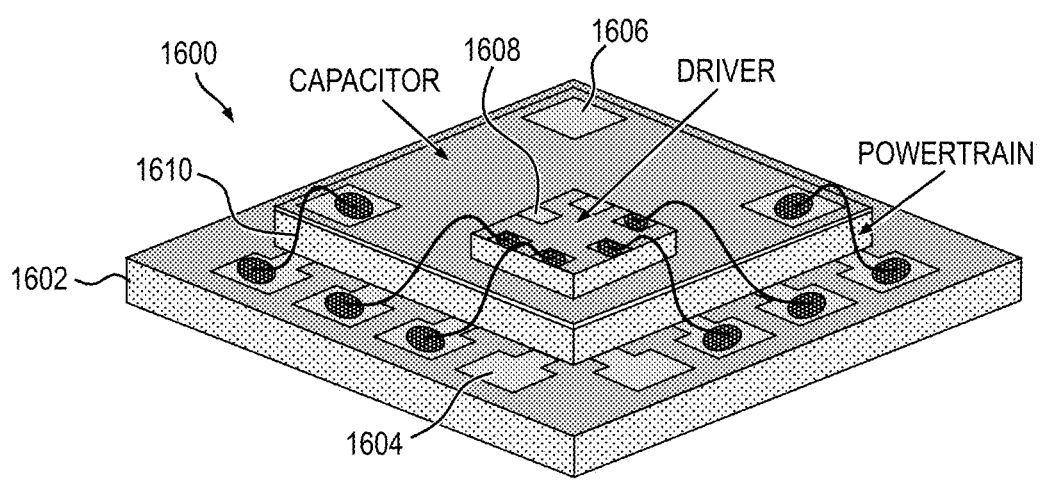

FIG. 16 is a top perspective view depicting at least a portion of a power management module 1600 showing an exemplary connection arrangement between a powertrain chip, a driver chip and an integrated capacitor, according to one or more embodiments of the invention. The power management module 1600 may be fabricated in a manner consistent with the illustrative power management module 1500 shown in FIG. 15, except that the TSVs 1510, 1512 are replaced with bond wires.

More particularly, with reference to FIG. 16, the power management module 1600 comprises a carrier or substrate 1602, which is preferably formed of a rigid material (e.g., silicon, etc.), having a plurality of conductive pads 1604 disposed on an upper surface of the substrate. The powertrain chip, in this embodiment, is oriented face down, so that connection structures (e.g., solder bumps, etc.) formed on an upper surface of the powertrain chip (not explicitly shown, but implied) are aligned with corresponding pads 1604 on the substrate 1602 for providing electrical connection to devices and/or circuitry formed in an active layer of the powertrain chip, proximate the upper surface thereof.

The integrated capacitor in the power management module 1600 is disposed on at least a portion of a back-side of the powertrain chip. The integrated capacitor may be formed in a manner consistent with the integrated capacitor shown in FIGS. 9A and 9B. Conductive pads 1606 formed on the back-side of the powertrain chip provide electrical connection to a top conductive layer of the integrated capacitor. In this embodiment, like the integrated capacitor in the illustrative power management module 1500 shown in FIG. 15, the top conductive layer of the integrated capacitor covers the entire back-side of the powertrain chip, although in other embodiments, the integrated capacitor may be formed on only a portion of the back-side of the powertrain chip, so that there is a region on the back-side of the powertrain chip which is devoid of the integrated capacitor.

In the illustrative embodiment shown in FIG. 16, the driver chip is oriented face up and disposed on the back-side of the powertrain chip in a stacked manner, such that a back-side of the driver chip and the back-side of the powertrain chip are facing each other. The driver chip may be attached to the powertrain chip using various known attachment means, such as, for example, a die attach layer (e.g., epoxy, solder, etc.). One or more conductive pads 1608 formed on an upper surface of the driver chip provide electrical connection on the upper surface of the driver chip to devices and/or circuitry formed in an active layer of the driver chip.

One or more bond wires 1610 connecting the conductive pads 1606 of the integrated capacitor and the corresponding conductive pads 1604 on the substrate 1602, or connecting the conductive pads 1608 of the driver chip and corresponding conductive pads 1604, provide electrical connection between the integrated capacitor and the powertrain chip, or between the driver chip and the powertrain chip, respectively.

Figure 17:
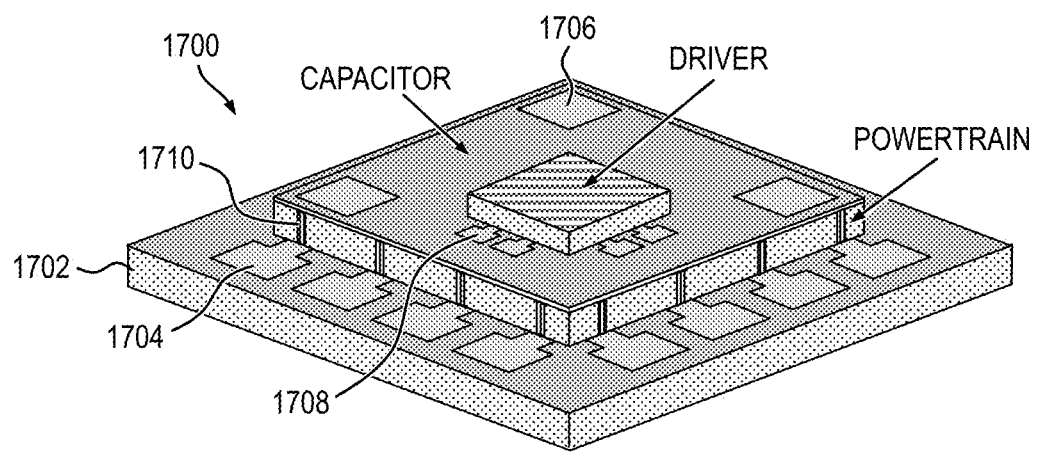

FIG. 17 is a top perspective view depicting at least a portion of a power management module 1700 showing an exemplary connection arrangement between a powertrain chip, a driver chip and an integrated capacitor, according to one or more embodiments of the invention. The power management module 1700 may be fabricated in a manner consistent with the illustrative power management module 1000 shown in FIG. 10.

With reference to FIG. 17, the power management module 1700 comprises a carrier or substrate 1702, which is preferably formed of a rigid material (e.g., silicon, etc.), having a plurality of conductive pads 1704 disposed on an upper surface thereof. The powertrain chip, in this embodiment, is oriented face down, so that connection structures (e.g., solder bumps, etc.) formed on an upper surface of the powertrain chip (not explicitly shown, but implied) are aligned with corresponding pads 1704 on the substrate 1702 for providing electrical connection to devices and/or circuitry formed in an active layer of the powertrain chip, proximate the upper surface thereof.

The integrated capacitor in the power management module 1700, like in the power management module 1600 depicted in FIG. 16, is disposed on at least a portion of a back-side of the powertrain chip. The integrated capacitor may be formed in a manner consistent with the integrated capacitor shown in FIGS. 9A and 9B. Conductive pads 1706 formed on the back-side of the powertrain chip provide electrical connection to a top conductive layer of the integrated capacitor. In this embodiment, like the integrated capacitor in the illustrative power management module 1500 shown in FIG. 15, the top conductive layer of the integrated capacitor covers the entire back-side of the powertrain chip, although in other embodiments, the integrated capacitor may be formed on only a portion of the back-side of the powertrain chip.

The driver chip in the power management module 1700 is oriented face down and disposed on the back-side of the powertrain chip in a stacked arrangement, such that an upper of the driver chip is facing the back-side of the powertrain chip. Connection structures (e.g., solder bumps, etc.) formed on the upper surface of the driver chip (not explicitly shown, but implied) are preferably aligned with corresponding conductive pads 1708 formed on the back-side of the powertrain chip, for providing electrical connection to the driver chip (e.g., between the driver chip and the powertrain chip and/or between the driver chip and the integrated capacitor). The driver chip may be attached to the powertrain chip using various known attachment means, such as, for example, a die attach layer (e.g., epoxy, solder, etc.).

Electrical connection between the powertrain chip and the integrated capacitor and between the powertrain chip and the driver chip is provided by way of one or more TSVs 1710 formed through a substrate of the powertrain chip. Each of the TSVs 1710 is aligned with corresponding conductive pads 1704 and 1708 formed on the substrate 1702 and back-side of the powertrain chip, respectively.

Figure 18:
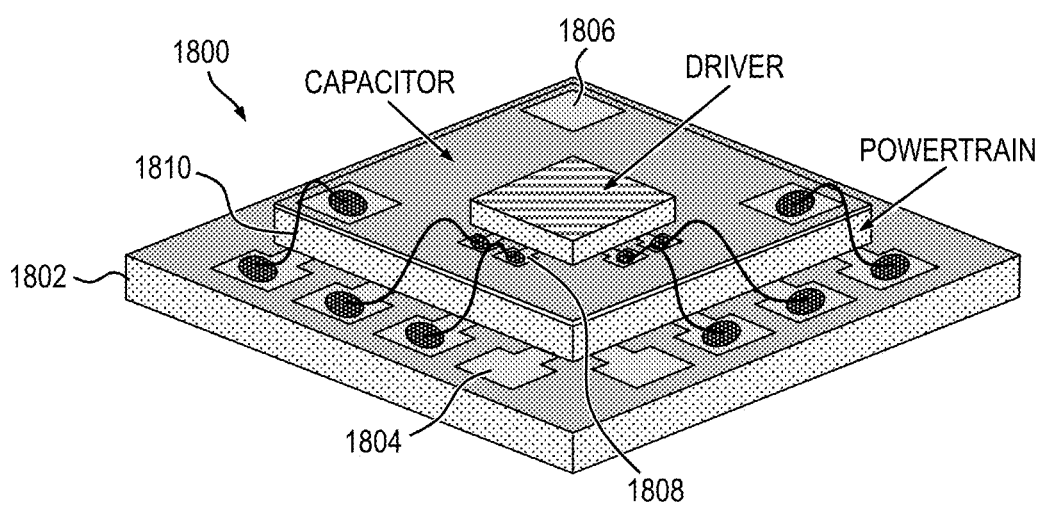

FIG. 18 is a top perspective view depicting at least a portion of a power management module 1800 showing an exemplary connection arrangement between a powertrain chip, a driver chip and an integrated capacitor, according to one or more embodiments of the invention. The power management module 1800 may be fabricated in a manner consistent with the illustrative power management module 1700 shown in FIG. 17, except that the TSVs 1710 are replaced with bond wires.

Specifically, with reference to FIG. 18, the power management module 1800 comprises a carrier or substrate 1802, which is preferably formed of a rigid material (e.g., silicon, etc.), having a plurality of conductive pads 1804 disposed on an upper surface thereof. The powertrain chip is oriented face down, so that connection structures (e.g., solder bumps, etc.) formed on an upper surface of the powertrain chip (not explicitly shown, but implied) are aligned with corresponding conductive pads 1804 on the substrate 1802 for providing electrical connection to devices and/or circuitry formed in an active layer of the powertrain chip, proximate the upper surface thereof.

The integrated capacitor in the power management module 1800, like in the power management module 1700 depicted in FIG. 17, is disposed on at least a portion of a back-side of the powertrain chip. The integrated capacitor may be formed in a manner consistent with the integrated capacitor shown in FIGS. 9A and 9B. Conductive pads 1806 formed on the back-side of the powertrain chip provide electrical connection to a top conductive layer of the integrated capacitor. In this embodiment, like the integrated capacitor in the illustrative power management module 1700 shown in FIG. 17, the top conductive layer of the integrated capacitor covers the entire back-side of the powertrain chip, although in other embodiments, the integrated capacitor may be formed on only a portion of the back-side of the powertrain chip.

The driver chip in the power management module 1800 is oriented face down and disposed on the back-side of the powertrain chip in a stacked arrangement, such that an upper of the driver chip is facing the back-side of the powertrain chip. Connection structures (e.g., solder bumps, etc.) formed on the upper surface of the driver chip (not explicitly shown, but implied) are preferably aligned with corresponding conductive pads 1808 formed on the back-side of the powertrain chip, for providing electrical connection to the driver chip (e.g., between the driver chip and the powertrain chip and/or between the driver chip and the integrated capacitor). The driver chip may be attached to the powertrain chip using various known attachment means, such as, for example, a die attach layer (e.g., epoxy, solder, etc.).

Unlike in the illustrative power management module 1700 depicted in FIG. 17, the driver chip in the power management module 1800 of FIG. 18 is oriented face down, thereby eliminating the need for TSVs in the driver chip; instead, electrical connection to devices and/or circuitry in the driver chip can be made, for example, using direct chip attachment (e.g., flip chip bonding, ball grid array, etc.) or the like. With regard to the powertrain chip in the power management module 1800, electrical connection between the powertrain chip and the integrated capacitor and between the powertrain chip and the driver chip is provided by way of one or more bond wires 1810. That is, electrical connection between the conductive pads 1806 (associated with the integrated capacitor) and the powertrain chip, and between the conductive pads 1808 (associated with the driver chip) and the powertrain chip is provided by corresponding bond wires 1810.

Figure 19A:
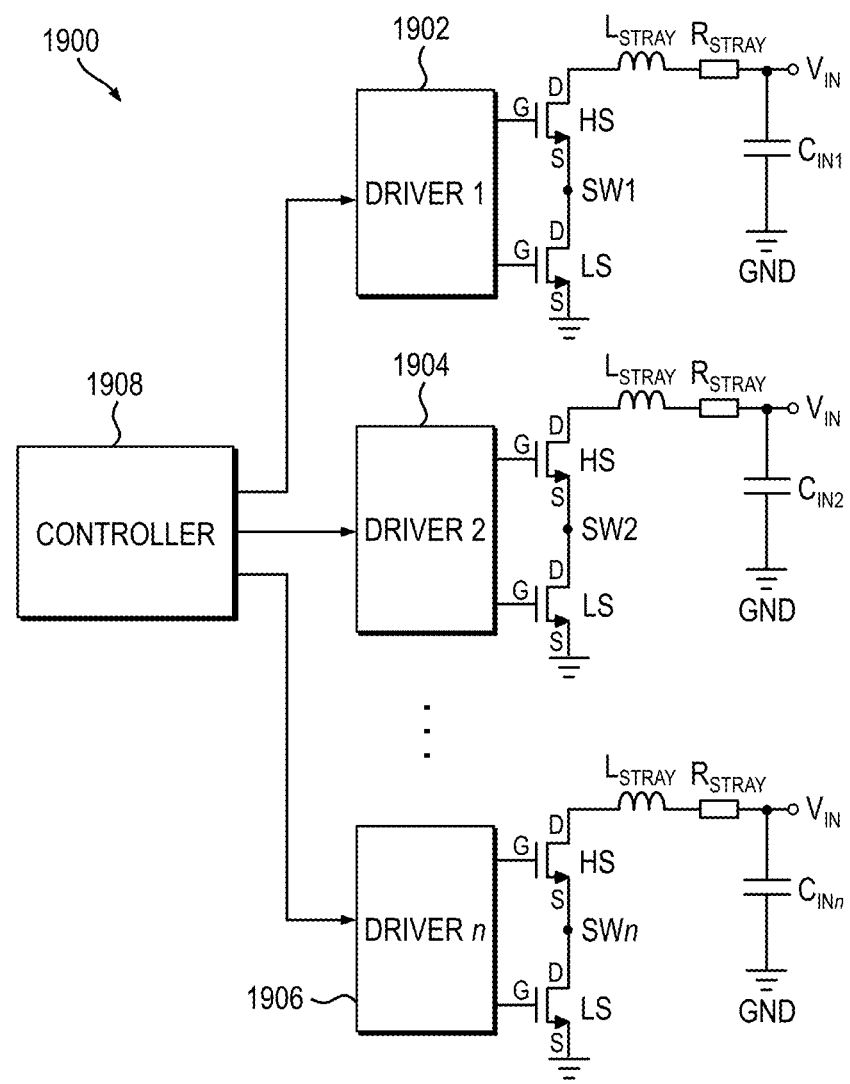
FIG. 19A is a schematic diagram depicting at least a portion of an exemplary multiple-phase power management circuit in which one or more aspects of the present invention can be employed.

As previously stated in conjunction with FIG. 1, principles of the invention, as manifested in one or more embodiments thereof, are well-suited for use in a DC-DC converter application, among other beneficial applications. FIG. 19A is a schematic diagram depicting at least a portion of an exemplary multiple-phase power management circuit 1900 in which one or more aspects of the present invention can be employed. The multiple-phase power management circuit 1900 comprises a plurality of driver circuits, including a first driver circuit (driver 1) 1902, a second driver circuit (driver 2) 1904, and an $n^{th}$ driver circuit (driver n) 1906, where n is an integer. Each of the driver circuits 1902, 1904, 1906 is configured to receive one or more control signals generated by a controller 1908 for driving corresponding power MOSFET devices to which the driver circuits are coupled.

More particularly, each driver circuit 1902, 1904, 1906 is configured to generate bias signals for activating a high-side MOSFET device, HS, and/or a low-side MOSFET device, LS, as a function of at least one of the control signals generated by the controller 1908. A first bias signal generated by each of the driver circuits 1902, 1904, 1906 is supplied to a gate (G) of the high-side MOSFET device, and a second bias signal generated by the driver circuit is supplied to a gate of the low-side MOSFET device. A source (S) of the high-side MOSFET device is connected to a drain (D) of the low-side MOSFET device at a switching node, SW1, SW2, or SWn, in the corresponding driver circuit 1902, 1904, or 1906, respectively. A drain of the high-side MOSFET device in each of the driver circuits 1902, 1904, 1906 is connected to an input voltage terminal, $V_{IN}$, of a corresponding phase of the multiple-phase power management circuit 1900, and a source of the low-side MOSFET device is coupled to a voltage return of the circuit, which is preferably ground (GND).

Figure 19B:
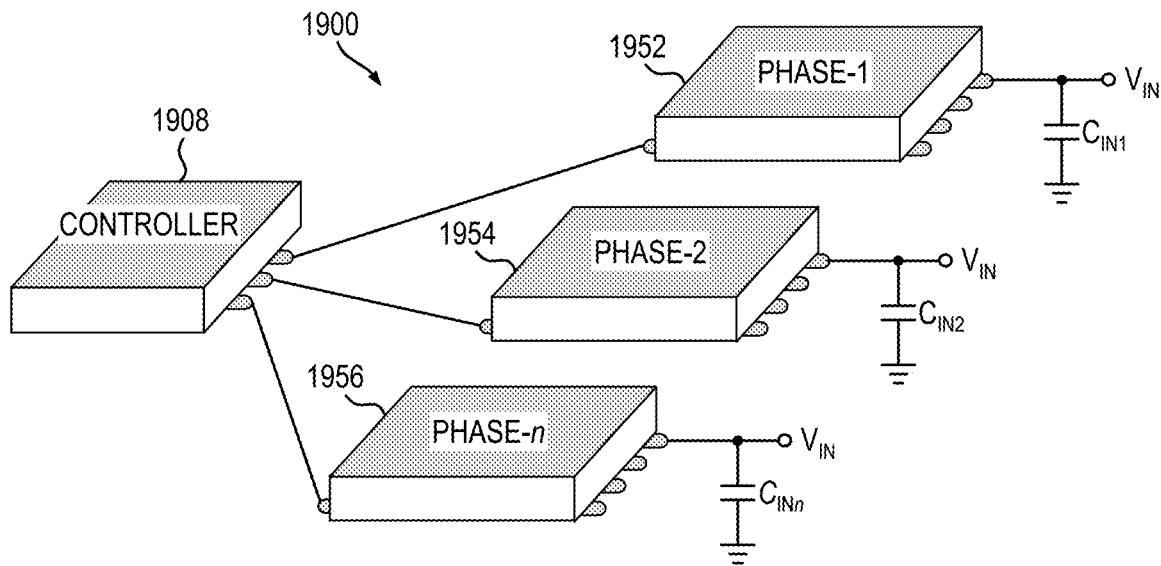
FIG. 19B is a top perspective view depicting at least a portion of the exemplary multiple-phase power management circuit shown in FIG. 19A.

The driver circuit and corresponding high-side and low-side MOSFET devices form a given phase circuit (1, 2, . . . , n) of the multiple-phase power management circuit 1900. FIG. 19B is a top perspective view depicting at least a portion of the exemplary multiple-phase power management circuit 1900 shown in FIG. 19A. With reference to FIG. 19B, a first phase circuit (phase-1) 1952 comprises the first driver circuit 1902 and corresponding high-side and low-side MOSFET devices, a second phase circuit (phase-2) 1954 comprises the second driver circuit 1904 and corresponding high-side and low-side MOSFET devices, and an $n^{th}$ phase circuit (phase-n) 1956 comprises the $n^{th}$ driver circuit 1906 and corresponding high-side and low-side MOSFET devices. Each of the phase circuits 1952, 1954, 1956 and the controller 1908 are fabricated as separate chips.

As shown in FIGS. 19A and 19B, an external input capacitor, $C_{IN1}$, $C_{IN2}$, $C_{INn}$, is often placed between the input voltage terminal $V_{IN}$ and ground in each phase circuit of the multiple-phase power management circuit 1900 in order to reduce voltage spikes at the input voltage terminal of the power management circuit. Each of the input capacitors $C_{IN1}$, $C_{IN2}$, $C_{INn}$ generally resides externally to the power management circuit 1900, since the capacitance value necessary for reducing voltage spikes is typically too large to be fabricated on-chip without consuming significant chip area. However, because the input capacitors $C_{IN1}$, $C_{IN2}$, $C_{INn}$, associated with each phase circuit 1952, 1954, 1956, respectively, resides externally to the power management circuit 1900, it cannot be connected in close proximity to the power MOSFET devices, HS and LS. Consequently, significant stray (i.e., parasitic) inductance, $L_{STRAY}$, and resistance, $R_{STRAY}$, will be introduced in series between the respective input capacitors $C_{IN1}$, $C_{IN2}$, $C_{INn}$, and the power MOSFET devices HS and LS associated with each phase circuit 1952, 1954, 1956. As previously stated, this stray impedance ($L_{STRAY}$ and $R_{STRAY}$) will lead to switch-mode ringing, which is undesirable.

Figure 20B:
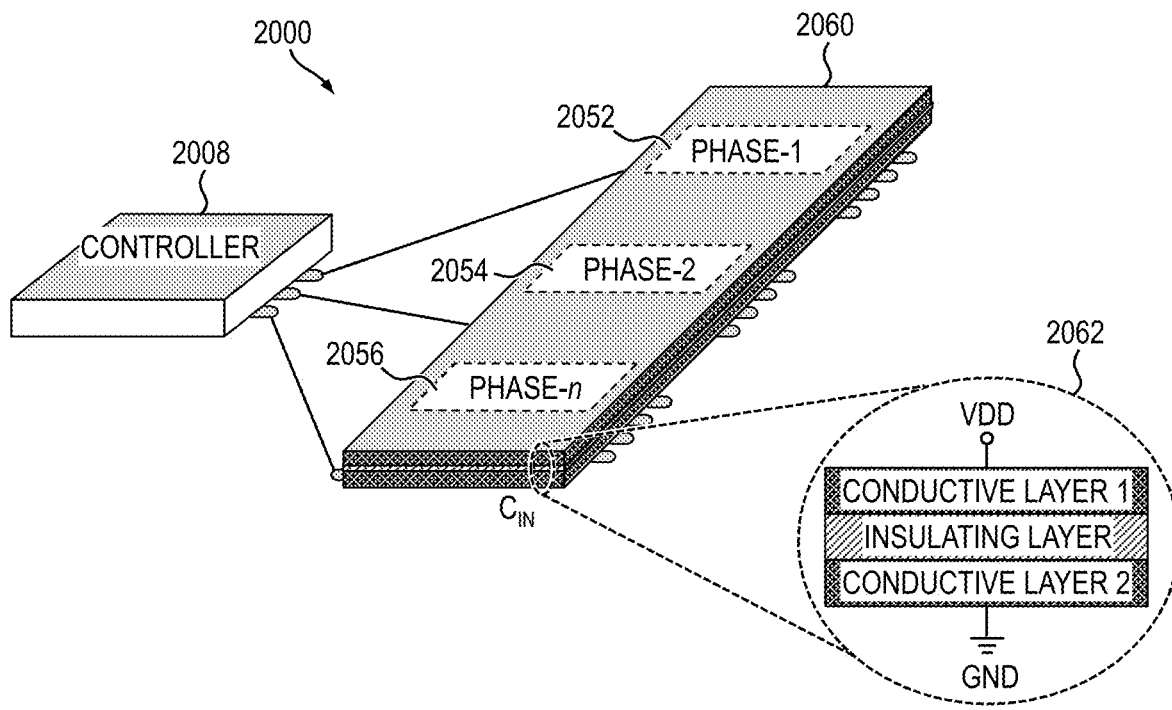
FIG. 20B is a top perspective view depicting at least a portion of the exemplary multiple-phase power management circuit shown in FIG. 20A, according to one or more embodiments of the present invention.
Figure 20A:
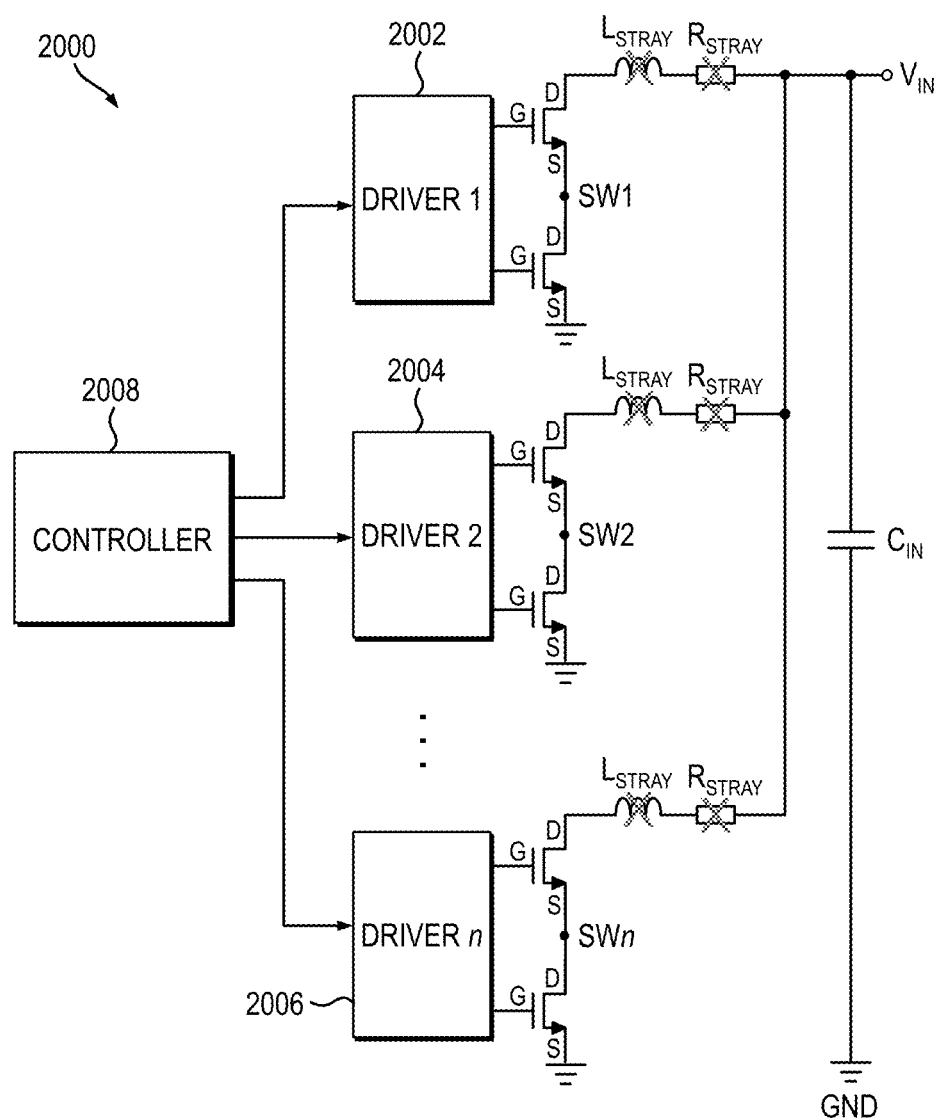
FIG. 20A is a schematic diagram depicting at least a portion of an exemplary multiple-phase power circuit having a shared integrated input capacitor, according to one or more embodiments of the present invention.

In one or more embodiments of the invention, the multiple-phase power management circuit can be fabricated as a multi-phase power module on a common wafer, and a shared input capacitor can be formed by back-side integration, consistent with the formation of the illustrative integrated capacitors described herein in conjunction with any of FIGS. 3-18. By way of example only and without limitation, FIG. 20A is a schematic diagram depicting at least a portion of an exemplary multiple-phase power management circuit 2000 having a shared integrated input capacitor, according to one or more embodiments of the invention. Like the power management circuit 1900 shown in FIG. 19A, the exemplary power management circuit 2000 comprises a plurality of driver circuits, including a first driver circuit (driver 1) 2002, a second driver circuit (driver 2) 2004, and an $n^{th}$ driver circuit (driver n) 2006, where n is an integer. Each of the driver circuits 2002, 2004, 2006 is configured to receive one or more control signals generated by a controller 2008 for driving corresponding power MOSFET devices to which the driver circuits are coupled.

Specifically, each driver circuit 2002, 2004, 2006 is configured to generate bias signals for activating a high-side MOSFET device, HS, and a low-side MOSFET device, LS, as a function of at least one of the control signals generated by the controller 2008. A first bias signal generated by each of the driver circuits 2002, 2004, 2006 is supplied to a gate (G) of the high-side MOSFET device, and a second bias signal generated by the driver circuit is supplied to a gate of the low-side MOSFET device. A source (S) of the high-side MOSFET device is connected to a drain (D) of the low-side MOSFET device at a switching node, SW1, SW2, or SWn, in the corresponding driver circuit 2002, 2004, or 2006, respectively. A drain of the high-side MOSFET device in each of the driver circuits 2002, 2004, 2006 is connected to an input voltage terminal, $V_{IN}$, of the multiple-phase power management circuit 2000, and a source of the low-side MOSFET device is coupled to a voltage return of the circuit, which is preferably ground (GND); that is, the drains of the respective high-side MOSFET devices are connected together and form the common input voltage terminal $V_{IN}$.

The driver circuits 2002, 2004, 2006 and corresponding high-side and low-side MOSFET devices form a given phase circuit (1, 2, . . . , n) of the multiple-phase power management circuit 2000. FIG. 20B is a top perspective view depicting at least a portion of the exemplary multiple-phase power management circuit 2000 shown in FIG. 20A, according to one or more embodiments of the invention. With reference to FIG. 20B, a first phase circuit (phase-1) 2052 comprises the first driver circuit 2002 and corresponding high-side and low-side MOSFET devices, a second phase circuit (phase-2) 2054 comprises the second driver circuit 2004 and corresponding high-side and low-side MOSFET devices, and an $n^{th}$ phase circuit (phase-n) 2056 comprises the $n^{th}$ driver circuit 2006 and corresponding high-side and low-side MOSFET devices. The phase circuits 2052, 2054 and 2056 are all fabricated on a common chip 2060. The phase circuits 2052, 2054 and 2056 can also be implemented as n separate chips stacked on the back-side of a common powertrain chip. Although shown as a separate chip, the controller 2008 may also be fabricated on the same chip as the phase circuits 2052, 2054, 2056, in one or more embodiments.

In contrast to the multiple-phase power management circuit 1900 shown in FIGS. 19A and 19B, the exemplary multiple-phase power management circuit 2000 shown in FIGS. 20A and 20B includes a shared input capacitor, $C_{IN}$, 2062 that is integrated with the phase circuits 2052, 2054, 2056. The input capacitor 2062, in one or more embodiments, includes first and second conductive layers (e.g., metal, doped polysilicon, etc.) separated by an insulating layer disposed therebetween, in a manner consistent with the formation of the illustrative integrated capacitor shown in FIG. 4D. Although depicted as a single integrated capacitor in FIG. 20B, it is to be appreciated that the integrated input capacitor 2062 may, in other embodiments, comprise multiple back-side capacitors, similar to the integrated capacitor structure 800 depicted in FIG. 8.

With reference to FIGS. 20A and 20B, the input capacitor $C_{IN}$ is placed between the input voltage terminal $V_{IN}$ and ground in order to reduce voltage spikes at the input voltage terminal of the power management circuit 2000. In the power management circuit 2000, since the input capacitor $C_{IN}$ is integrated with the phase circuits 2052, 2054, 2056, preferably in close proximity to the power MOSFET devices, stray inductance ($L_{STRAY}$) and resistance ($R_{STRAY}$) is eliminated, or at least significantly reduced, thereby beneficially improving high-frequency performance in the power management device 2000.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary structures or devices illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having high-density integrated capacitor devices therein formed in accordance with one or more embodiments of the invention, such as, for example, DC-DC converters, radio frequency (RF) power amplifiers, etc.

An integrated circuit in accordance with aspects of the present disclosure can be employed in essentially any high-frequency, high-power application and/or electronic system. Suitable systems for implementing embodiments of the invention may include, but are not limited to, DC-DC converters. Systems incorporating such integrated circuits are considered part of this invention. Given the teachings of the present disclosure provided herein, one of ordinary skill in the art will be able to contemplate other implementations and applications of embodiments of the invention.

The illustrations of embodiments of the invention described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as, but not limited to, "upper," "back-side," "above" and "below," are used to indicate relative positioning of elements or structures to each other as opposed to absolute position. For instance, it is to be appreciated that a surface that is described herein as being an "upper" surface of a certain layer or structure may become a "back-side" or "lower" surface of the same layer or structure when oriented upside-down from its initial position.

The corresponding structures, materials, acts, and equivalents of all means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus, the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A semiconductor structure, comprising:
    at least a first chip, the first chip comprising a semiconductor substrate and an active layer formed on an upper surface of the substrate, one or more lateral metal-oxide semiconductor (MOS) devices being formed in the active layer of the first chip;
    at least a first integrated capacitor disposed on a back-side of the semiconductor substrate of the first chip, the first integrated capacitor comprising a first conductive layer in electrical connection with the back-side of the substrate, an insulating layer formed on at least a portion of an upper surface of the first conductive layer, and a second conductive layer formed on at least a portion of an upper surface of the insulating layer; and
    a second chip disposed in a stacked arrangement relative to the first chip, the at least a first integrated capacitor being between the first and second chips.

2. The semiconductor structure according to claim 1, wherein the first conductive layer of the first integrated capacitor comprises a doped region formed on the back-side of the semiconductor substrate of the first chip.

3. The semiconductor structure according to claim 1, wherein the first conductive layer of the first integrated capacitor comprises a back-side portion of the semiconductor substrate that is doped with an n-type or p-type impurity of a prescribed doping concentration level to thereby lower a resistivity of the back-side portion of the semiconductor substrate of the first chip.

4. The semiconductor structure according to claim 1, wherein the first conductive layer of the first integrated capacitor comprises a metal layer formed on the back-side of the semiconductor substrate of the first chip.

5. The semiconductor structure according to claim 1, wherein the first and second conductive layers of the first integrated capacitor are formed of different materials.

6. The semiconductor structure according to claim 1, wherein the second chip comprises driver circuitry and the first chip comprises at least one power MOS transistor, the at least a first integrated capacitor being electrically coupled to at least one of the driver circuitry and the at least one power MOS transistor.

7. The semiconductor structure according to claim 6, further comprising at least a second integrated capacitor disposed on an upper surface of the first integrated capacitor and between the first and second chips, the first integrated capacitor being electrically coupled with the at least one power MOS transistor, and the second integrated capacitor being electrically coupled with the driver circuitry.

8. The semiconductor structure according to claim 1, further comprising a die attach layer formed between the at least a first integrated capacitor and the second chip for attachment of the first and second chips.

9. The semiconductor structure according to claim 8, wherein the die attach layer comprises at least one of conductive material and non-conductive material.

10. The semiconductor structure according to claim 1, wherein the first and second chips are stacked such that back-sides of the first and second chips are facing one another.

11. The semiconductor structure according to claim 1, wherein the first and second chips are stacked such that the back-side of the first chip is facing a front-side of the second chip.

12. The semiconductor structure according to claim 1, further comprising at least one of (i) one or more through-silicon vias (TSVs) formed through the at least one of the first and second chips, and (ii) wire bonding, wherein electrical connection between the first and second chips and the at least a first integrated capacitor is made using at least one of the TSVs and the wire boding.

13. The semiconductor structure according to claim 1, wherein the second chip comprises a semiconductor substrate and an active layer formed on an upper surface of the substrate of the second chip, one or more lateral MOS devices being formed in the active layer of the second chip, and wherein the second conductive layer of the at least a first integrated capacitor comprises a back-side portion of the semiconductor substrate of the second chip that is doped with an n-type or p-type impurity of a prescribed doping concentration level to thereby lower a resistivity of the back-side portion of the semiconductor substrate of the second chip.

14. The semiconductor structure according to claim 1, further comprising a second chip disposed in a stacked arrangement relative to the first chip, the at least a first integrated capacitor being arranged between the first and second chips, wherein the first chip is a powertrain chip and the second chip is a driver chip, and wherein the at least first integrated capacitor is at least one of an input capacitor connected between ground and a power supply of the powertrain chip, and a bootstrap capacitor connected between a switching node of the powertrain chip and a node of driver circuitry in the driver chip.

15. A semiconductor structure, comprising:
    at least a first chip, the first chip comprising a semiconductor substrate and an active layer formed on an upper surface of the substrate, one or more lateral metal-oxide semiconductor (MOS) devices being formed in the active layer of the first chip;
    at least a first integrated capacitor disposed on a back-side of the semiconductor substrate of the first chip, the first integrated capacitor comprising a first conductive layer in electrical connection with the back-side of the substrate, an insulating layer formed on at least a portion of an upper surface of the first conductive layer, and a second conductive layer formed on at least a portion of an upper surface of the insulating layer; and at least a second integrated capacitor disposed on an upper surface of the first integrated capacitor, the second integrated capacitor comprising a first conductive layer shared in common with the second conductive layer of the first integrated capacitor, an insulating layer formed on at least a portion of an upper surface of the first conductive layer of the second integrated capacitor, and a second conductive layer formed on at least a portion of an upper surface of the insulating layer of the second integrated capacitor.

16. The semiconductor structure according to claim 15, wherein a width of the insulating and second conductive layers of the second integrated capacitor are less than a width of the second conductive layer of the first integrated capacitor to provide access for electrical connection to the second conductive layer of the first integrated capacitor.

17. A method of fabricating a semiconductor structure, the method comprising:
 forming at least a first chip, the first chip comprising a semiconductor substrate and an active layer formed on an upper surface of the substrate, one or more lateral metal-oxide semiconductor (MOS) devices being formed in the active layer of the first chip;
 forming at least a first integrated capacitor on a back-side of the semiconductor substrate of the first chip, the first integrated capacitor comprising a first conductive layer in electrical connection with the back-side of the substrate, an insulating layer formed on at least a portion of an upper surface of the first conductive layer, and a second conductive layer formed on at least a portion of an upper surface of the insulating layer; and
 forming a second chip on a back-side of the first chip in a stacked arrangement relative to the first chip, the at least a first integrated capacitor being formed between the first and second chips.

18. The method according to claim 17, wherein forming the first integrated capacitor comprises doping a back-side portion of the semiconductor substrate with an n-type or p-type impurity of a prescribed doping concentration level to thereby lower a resistivity of the back-side portion of the semiconductor substrate of the first chip, the doped back-side portion of the substrate of the first chip forming the first conductive layer of the first integrated capacitor.

19. The method according to claim 17, wherein the second chip comprises a semiconductor substrate and an active layer formed on an upper surface of the substrate of the second chip, one or more lateral MOS devices being formed in the active layer of the second chip, and wherein the second conductive layer of the at least a first integrated capacitor is formed by doping a back-side portion of the semiconductor substrate of the second chip with an n-type or p-type impurity of a prescribed doping concentration level to thereby lower a resistivity of the back-side portion of the semiconductor substrate of the second chip.

20. The method according to claim 17, wherein the second chip comprises driver circuitry and the first chip comprises at least one power MOS transistor, the at least a first integrated capacitor being electrically coupled to at least one of the driver circuitry and the at least one power MOS transistor.

21. A semiconductor multiple-phase power management module, comprising:
 a multiple-phase powertrain chip, the multiple-phase powertrain chip including a semiconductor substrate and an active layer formed on an upper surface of the substrate, a plurality of lateral metal-oxide semiconductor (MOS) devices being formed in the active layer of the multiple-phase powertrain chip;
 a plurality of driver chips disposed in a stacked arrangement on a back-side of the multiple-phase powertrain chip, each of the driver chips including driver circuitry for controlling a corresponding one of the lateral MOS devices formed in the multiple-phase powertrain chip; and
 at least a first integrated capacitor disposed between the plurality of driver chips and the multiple-phase powertrain chip, the at least a first integrated capacitor comprising a first conductive layer in electrical connection with the back-side of the substrate of the multiple-phase powertrain chip, an insulating layer formed on at least a portion of an upper surface of the first conductive layer, and a second conductive layer formed on at least a portion of an upper surface of the insulating layer.

22. The multiple-phase power management module according to claim 21, wherein the plurality of driver chips are formed on a common semiconductor substrate, the common semiconductor substrate of the driver chips being disposed on the at least a first integrated capacitor in a stacked arrangement.

* * * * *